US008768514B2

(12) United States Patent
Hoshikawa

(10) Patent No.: US 8,768,514 B2
(45) Date of Patent: Jul. 1, 2014

(54) IMAGE TAKING SYSTEM AND ELECTRONIC-CIRCUIT-COMPONENT MOUNTING MACHINE

(75) Inventor: Kazumi Hoshikawa, Toyohashi (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 453 days.

(21) Appl. No.: 12/662,620

(22) Filed: Apr. 26, 2010

(65) Prior Publication Data

US 2010/0305756 A1    Dec. 2, 2010

(30) Foreign Application Priority Data

May 29, 2009 (JP) ................................ 2009-131636
Apr. 9, 2010 (JP) ................................ 2010-090264

(51) Int. Cl.
*G01B 11/24* (2006.01)
*B23P 21/00* (2006.01)

(52) U.S. Cl.
USPC ........... 700/259; 382/151; 382/153; 382/144; 382/145; 382/152; 382/284; 348/92; 29/721

(58) Field of Classification Search
USPC ........... 700/259, 245, 258; 414/783; 382/219, 382/151, 153, 141, 144, 145, 149, 152, 382/284; 29/740, 743, 721; 348/86, 92
See application file for complete search history.

(56) References Cited

U.S. PATENT DOCUMENTS

| 5,555,090 A | 9/1996 | Schmutz |
| 5,570,993 A * | 11/1996 | Onodera et al. ............... 414/783 |
| 5,661,561 A | 8/1997 | Wurz et al. |
| 5,777,746 A | 7/1998 | Dlugos |
| 5,900,940 A * | 5/1999 | Aoshima ....................... 356/614 |
| 6,177,730 B1 | 1/2001 | Kira et al. |
| 6,291,269 B1 | 9/2001 | Kira et al. |

(Continued)

FOREIGN PATENT DOCUMENTS

| CN | 1795364 A | 6/2006 |
| JP | A-8-167799 | 6/1996 |

(Continued)

OTHER PUBLICATIONS

Nov. 1, 2013 Office Action issued in Chinese Patent Application No. 201010195069.6 (with translation).

(Continued)

*Primary Examiner* — Ronnie Mancho
(74) *Attorney, Agent, or Firm* — Oliff PLC

(57) ABSTRACT

An image taking system including: (a) a lighting device capable of changing a light emission time to various time length values; (b) an image taking device configured to take an image of a subject portion while light is being emitted by the lighting device; (c) a subject-portion moving device configured to move the subject portion relative to the image taking device, and capable of changing a movement velocity of the subject portion relative to the image taking device, to various velocity values; and (d) a control device configured, during movement of the subject portion by the subject-portion moving device, to cause the lighting device to emit the light for one of the time length values as the light emission time and to cause the image taking device to take the image, and is configured to control the movement velocity, such that an amount of the movement of the subject portion for the above-described one of the time length values is not larger than a predetermined movement amount.

14 Claims, 15 Drawing Sheets

(56) References Cited

U.S. PATENT DOCUMENTS

| | | | |
|---|---|---|---|
| 6,608,320 B1* | 8/2003 | Skunes et al. | 250/559.19 |
| 7,813,559 B2* | 10/2010 | Duquette et al. | 382/219 |
| 2007/0013803 A1 | 1/2007 | Hoshikawa et al. | |

FOREIGN PATENT DOCUMENTS

| JP | A-2000-124683 | 4/2000 |
|---|---|---|
| JP | A-2000-312099 | 11/2000 |
| JP | A-2003-19820 | 1/2003 |
| JP | A-2006-005142 | 1/2006 |
| JP | A-2006-54484 | 2/2006 |
| JP | A-2008-160136 | 7/2008 |

OTHER PUBLICATIONS

Mar. 4, 2014 Office Action issued in Japanese Patent Application No. 2010-090264 (with translation).

* cited by examiner

FIG.13

| KIND OF ELECTRONIC CIRCUIT COMPONENT | ALLOWABLE IMAGE-SHAKE AMOUNT |
|---|---|
| Q F P | 25 μm |
| BEAR CHIP | 25 μm |
| CONNECTOR | 25 μm |
| CHIP COMPONENT | 40 μm |
| ⋮ | ⋮ |

FIG.14

ALLOWABLE IMAGE-SHAKE AMOUNT; 25 μm

| REFLECTANCE | LIGHT EMISSION TIME | MOVEMENT VELOCITY | ALLOWABLE IMAGE-SHAKE AMOUNT | EXPASURE FACTOR |
|---|---|---|---|---|
| HIGH | 20 μs | 1.25m/s | 25 μm | 1.0 |
| STANDARD | 40 μs | 0.625m/s | 25 μm | 2.0 |
| LOW | 80 μs | 0.3125m/s | 25 μm | 4.0 |

ALLOWABLE IMAGE-SHAKE AMOUNT; 40 μm

| REFLECTANCE | LIGHT EMISSION TIME | MOVEMENT VELOCITY | ALLOWABLE IMAGE-SHAKE AMOUNT | EXPASURE FACTOR |
|---|---|---|---|---|
| HIGH | 20 μs | 2m/s | 40 μm | 1.0 |
| STANDARD | 40 μs | 1m/s | 40 μm | 2.0 |
| LOW | 80 μs | 0.5m/s | 40 μm | 4.0 |

ALLOWABLE IMAGE-SHAKE AMOUNT; 50 μm

| REFLECTANCE | LIGHT EMISSION TIME | MOVEMENT VELOCITY | ALLOWABLE IMAGE-SHAKE AMOUNT | EXPASURE FACTOR |
|---|---|---|---|---|
| HIGH | 20 μs | 2.5m/s | 50 μm | 1.0 |
| STANDARD | 40 μs | 1.25m/s | 50 μm | 2.0 |
| LOW | 80 μs | 0.625m/s | 50 μm | 4.0 |

IMAGE TAKING SYSTEM AND ELECTRONIC-CIRCUIT-COMPONENT MOUNTING MACHINE

CROSS REFERENCE TO RELATED APPLICATION

This application claims priority from Japanese Patent Applications No. 2009-131636 filed on May 29, 2009 and No. 2010-090264 filed on Apr. 9, 2010, the disclosures of which are herein incorporated by reference in its entirety.

BACKGROUND OF THE INVENTION

1. Field of the Invention

The present invention relates to an image taking system, and also to an electronic-circuit-component mounting machine including the image taking system.

2. Discussion of Related Art

There is known an electronic-circuit-component mounting machine, as disclosed in JP-H08-167799A and JP-2000-124683A, in which a component-image taking system is provided to take an image of each electronic circuit component that is held by a component holding head. JP-H08-167799A discloses a component-image taking system which is equipped with a lighting device and a line sensor, and which is disposed in a fixed position located between a component supplier and a board conveyor. The lighting device includes a multiplicity of LEDs (light emitting diodes), while the line sensor includes a plurality of CCDs (charge coupled devices) arranged in a line parallel to an arrangement direction in which the component supplier and the board conveyor are arranged. The component holding head holding the electronic circuit component is moved in a direction perpendicular to the arrangement direction (in which the component supplier and the board conveyor are arranged), so that an entirety of the electronic circuit component is caused to pass over the line sensor whereby an image of the entirety of the electronic circuit component is acquired. The lighting device is configured to emit light that is adjusted depending on velocity of movement of the component holding head. Where the electronic circuit component held by the holding head has an easily recognizable and simple configuration, the component holding head is moved at an increased velocity while quantity of the light emitted by the lighting device is made large, for thereby reducing the image taking time and acquiring the image having brightness suitable for processing. Where the electronic circuit component held by the holding head has a complicated configuration, the component holding head is moved at a reduced velocity while quantity of the light emitted by the lighting device is made small, for thereby acquiring the image having brightness suitable for processing, and enabling the image to be accurately processed.

JP-2000-124683A discloses a component-image taking system which is equipped with a lighting device and a CCD camera and which is movable, by a moving device, relative to a component holding head in a direction parallel to a movement direction in which a movable body carrying the component holding head is to be moved. The lighting device includes LEDs, while the CCD camera includes a CCD and an electronic shutter. After the component holding head has received the electronic circuit component from a component supplier, the component-image taking system is moved relative to the component holding head and takes an image of the electronic circuit component. In this instance, the electronic shutter of the CCD camera allows the CCD to be exposed for an exposure time, i.e., a length of time that is dependent on a predetermined shutter speed, while the lighting device is caused to emit flashlight within the exposure time so as to illuminate the electronic circuit component. An electric current, which is supplied to each of the LEDs, is controlled such that the electric current is instantaneously supplied by an amount larger than a rated amount by which the electric current is to be supplied for causing the lighting device to be continuously lighted, whereby the lighting device is caused to emit a larger quantity of the light than where the lighting device is continuously lighted, for thereby sufficiently illuminating the electronic circuit component.

SUMMARY OF THE INVENTION

In the conventional image taking system, however, there is still room for improvements. For example, the quantity of the emitted light is determined dependent on the movement velocity of the component holding head in the component-image taking system disclosed in JP-H08-167799A. The light emission time of the lighting device is determined dependent on the shutter speed of the CCD camera in the component-image taking system disclosed in JP-2000-124683A. The quantity of the light, which is determined depending on the movement velocity or shutter speed, is not necessarily an quantity that precisely provides the image having brightness suitable for the subsequent processing applied to the image. In this respect, there is room for improvements.

The present invention was made in view of such a background, and an object of the invention is to provide an image taking system having a higher practicability, and also an electronic-circuit-component mounting machine including the component-image taking system having the higher practicability.

The above object may be achieved by a first aspect of the invention, which provides an image taking system including: (A) a lighting device capable of changing a light emission time to a plurality of time length values that are different from each other; (B) an image taking device configured to take an image of a subject portion while light is being emitted by the lighting device; (C) a subject-portion moving device configured to move the subject portion relative to the image taking device, in a direction substantially orthogonal to or intersecting with an opposed direction in which the image taking device and the subject portion are opposed to each other, and capable of changing a movement velocity of the subject portion relative to the image taking device, to a plurality of velocity values that are different from each other; and (D) a control device configured, during movement of the subject portion by the subject-portion moving device, to cause the lighting device to emit the light for a given light emission time as one of the plurality of time length values as the light emission time and to cause the image taking device to take the image of the subject portion, and is configured to control the movement velocity at which the subject portion is moved by the subject-portion moving device, such that an amount of the movement of the subject portion for the given light emission time is not larger than a predetermined movement amount.

The subject portion, whose image is to be taken, may be either an entirety or a part of a member.

The lighting device is capable of changing the light emission time to the plurality of time length values. In other words, the lighting device is capable of changing the light emission time such that the light emission time can be equalized to any one of the plurality of time length values.

The light emission time of the lighting device may be changeable or variable either in a plurality of steps or without steps. In the latter case, it may be regarded that the light emission time is variable in an infinite number of steps, and the above-described plurality of time length values may be interpreted to mean an infinite number of time length values.

The subject-portion moving device is capable of changing the movement velocity of the subject portion relative to the image taking device, to the plurality of velocity values. In other words, the subject-portion moving device is capable of changing the movement velocity such that the movement velocity can be equalized to any one of the plurality of velocity values.

The movement velocity (by which the subject portion is moved relative to the image taking device by the subject-portion moving device) also may be changeable or variable either in a plurality of steps or without steps. In the latter case, it may be regarded that the movement velocity is variable in an infinite number of steps, and the above-described plurality of velocity values may be interpreted to mean an infinite number of velocity values.

Where the movement velocity is variable without steps, the control device is configured to control the subject-portion moving device such that the movement velocity is substantially equalized to a certain velocity value (that causes the subject portion to be moved relative to the image taking device for the light emission time by an appropriate amount that is not larger than the above-described predetermined movement amount). Where the movement velocity is variable only in steps, namely, where the movement velocity is set to one of a finite number of velocity values, the control device is configured to control the subject-portion moving device such that the movement velocity is set to one of the finite number of velocity values which is the highest within a range that is not higher than the above-described certain velocity value.

Where the movement device is provided by a device capable of varying the movement velocity without steps, the subject portion can be moved at the certain velocity value, whereby the amount of the movement of the subject portion for the light emission time can be substantially equalized to the predetermined movement amount, no matter how high or low the certain velocity value is. Where the movement device is provided by a device capable of varying the movement velocity only in steps, if one of the finite number of velocity values equals to the certain velocity value, the subject portion can be moved at the certain velocity value, whereby the amount of the movement of the subject portion for the light emission time can be substantially equalized to the predetermined movement amount. However, where the movement device is provided by the device capable of varying the movement velocity only in steps, if none of the finite number of velocity values equals to the certain velocity value, the subject portion is moved at one of the finite number of velocity values which is lower than the certain velocity value and which is the closest to the certain velocity value, whereby the amount of the movement of the subject portion for the light emission time is smaller than the predetermined movement amount.

As a camera or an image sensor that is to be included in the image taking device, it is possible to employ, for example, a CCD camera or a CMOS (complementary metal oxide semiconductor) image sensor.

It is noted that the amount of the movement of the subject portion (relative to the image taking device) for the light emission time may be interpreted to be equal to a product of the movement velocity of the subject portion (relative to the image taking device) and the light emission time.

The above object may be achieved also by a second aspect of the invention, which provides an electronic-circuit-component mounting machine including: (a) a board holder configured to hold a circuit board; (b) a component mounter configured to mount an electronic circuit component onto the circuit board that is held by the board holder; (c) a component supplier configured to supply the electronic circuit component to the component mounter, whereby the electronic circuit component is received by a component holder of the component mounter; (d) a component-image taking system configured to take an image of at least a part of the electronic circuit component which is held by the component holder; (e) an image processor configured to obtain a positional error of the electronic circuit component which is held by the component holder, based on the image taken by the component-image taking system; and (f) a component mounting controller configured to control the component mounter such that the electronic circuit component is mounted onto the circuit board with the positional error being at least reduced, wherein the component-image taking system is provided by the image taking system that is constructed according to the present invention.

Where the image of the subject portion is taken during the movement of the subject portion relative to the image taking device, the subject portion is not required to be stopped for taking the image during the movement of the subject portion from a movement start point to a movement end point. The elimination of necessity of stopping the subject portion leads to improvement in operational efficiency.

However, for satisfactorily acquiring the image of the subject portion, the image taking device is required to receive a certain quantity of light reflected from the subject portion or reflected from its background. Therefore, the subject portion requires to be illuminated for a length of time which is larger where a light reflectance of the subject portion or its background is low than where the light reflectance is high.

Since the image of the subject portion is taken by the image taking device while the light is being emitted by the lighting device, the quantity of light received by the image taking device can be increased by increasing the light emission time. However, the increase of the light emission time leads to also increase of an amount of shake of the image taken by the image taking device. Further, even without change of the light emission time, the amount of shake of the image is increased with increase of the movement velocity of the subject portion that is moved by the subject-portion moving device.

For accurately acquiring the image of the subject portion, an actual amount of shake of the image has to be not larger than an allowable amount of shake of the image. The above-described predetermined movement amount of the subject portion for the light emission time represents the allowable amount of the image shake which is determined for the subject portion.

In the image taking system and the electronic-circuit-component mounting machine according to the invention, where the light reflectance of the subject portion or its background is low, for example, the light device is caused to emit the light for a large time length value as the light emission time so as to assure the certain quantity of the light received by the image taking device, while the subject-portion moving device is caused to move the subject portion at a low velocity value as the movement velocity so as to avoid the actual amount of the image shake from being larger than the allowable amount of the image shake. On the other hand, where a light reflectance of the subject portion or its background is high, for example, the light device is caused to emit the light for a small time length value as the light emission time while the subject-portion moving device is caused to move the subject portion at a high velocity value as the movement velocity, for thereby establishing a high operational efficiency and also avoiding the actual amount of the image shake from being larger than the allowable amount of the image shake.

Thus, in the image taking system and the electronic-circuit-component mounting machine according to the invention, the subject portion can be illuminated in view of the light reflectance of the subject portion or its background, for thereby making it possible to acquire the image of the subject portion having brightness suitable for the image processing, no matter how high or low the light reflectance of the subject portion is. For example, where the subject portion has a surface like a mirror finished surface so that the light reflectance is high, it is possible to avoid the image from being too bright, by reducing the light emission time. Where the subject portion has a gray or other color that makes the light reflectance low, it is possible to cause the image to have suitable brightness, by increasing the light emission time.

In the electronic-circuit-component mounting machine according to the invention, at least a part of the electronic circuit component is the subject portion, so that the image of at least the part of the component is taken while at least the part of the component is being illuminated, and at least the part of the component is moved by an amount that is not larger than the above-described predetermined movement amount. It is therefore possible to acquire the image having brightness suitable for the image processing that is required for accurately obtaining the positional error of the component that is held by the component holder, and to avoid the amount of the image shake from exceeding the predetermined movement amount, for thereby improving accuracy in obtaining the positional error, and consequently making it possible to improve accuracy in mounting the component onto the circuit board while avoiding reduction of efficiency for mounting the component onto the circuit board.

VARIOUS MODES OF THE INVENTION

There will be described various modes of the invention (hereinafter referred to as "claimable invention" where appropriate) deemed to contain claimable features for which protection is sought. Each of these modes of the invention is numbered like the appended claims and depends from the other mode or modes, where appropriate, for easier understanding of the technical features disclosed in the present specification. It is to be understood that the present invention is not limited to the technical features or any combinations thereof which will be described, and shall be constructed in the light of the following descriptions of the various modes and preferred embodiments of the invention. It is to be further understood that a plurality of elements or features included in any one of the following modes of the invention are not necessarily provided all together, and that the invention may be embodied with selected at least one of the elements or features described with respect to the same mode. It is to be still further understood that a plurality of elements or features included in any one of the following modes of the invention may be combined with at least one additional element or feature in the light of the following descriptions of the various modes and the preferred embodiments of the invention, and that the invention may be embodied with such a possible combination with respect to the same mode.

(1) An image taking system including:

(a) a lighting device capable of changing a light emission time to a plurality of time length values that are different from each other;

(b) an image taking device configured to take an image of a subject portion while light is being emitted by the lighting device;

(c) a subject-portion moving device configured to move the subject portion relative to the image taking device, in a direction substantially orthogonal to an opposed direction in which the image taking device and the subject portion are opposed to each other, and capable of changing a movement velocity of the subject portion relative to the image taking device, to a plurality of velocity values that are different from each other; and (d) a control device configured, during movement of the subject portion by the subject-portion moving device, to cause the lighting device to emit the light for a given light emission time as one of the plurality of time length values and to cause the image taking device to take the image of the subject portion, and is configured to control the movement velocity at which the subject portion is moved by the subject-portion moving device, such that an amount of the movement of the subject portion for the given light emission time is not larger than a given movement amount.

(2) The image taking system according to mode (1), wherein the control device includes:

(d-1) a light-emission-time/movement-velocity memory portion configured to memorize a plurality of sets each including the given light emission time and a given movement velocity (as one of the plurality of velocity values), such that the given light emission time and the given movement velocity which are memorized in the light-emission-time/movement-velocity memory portion are associated with a kind of the subject portion;

(d-2) a subject-portion obtaining portion configured to obtain the kind of the subject portion whose image is to be taken by the image taking device; and (d-3) a light-emission-time/movement-velocity reading portion configured to read, from the light-emission-time/movement-velocity memory portion, the given light emission time and the given movement velocity which are associated with the obtained kind of the subject portion.

Where the subject portion is an entirety of an electronic circuit component, for example, the above-described "kind" of the subject portion may be interpreted to mean a model number which varies depending on a recognizable appearance of the electronic circuit component, rather than an identification code which identifies each electronic circuit component and which varies from component to component. Where the subject portion is a part of an electronic circuit component such as leads, ball grid arrays or a main body portion of the electronic circuit component, for example, the above-described "kind" of the subject portion may be interpreted to mean kind of the component part which varies depending on, for example, a recognizable appearance of the component part or a material of the component part.

In most cases, it is necessary to acquire an edge (serving as a boundary at which optical properties are sharply changed) of the subject portion. Whether the edge can be satisfactorily acquired or not, in general, depends on the optical properties of the subject portion and a portion adjacent to the subject portion, rather than on only the optical properties of the subject portion. Therefore, it may be regarded that a subject portion (herein referred to as "first subject portion") is different from another subject portion (herein referred to as "second subject portion") in kind, where a difference between the light reflectance of the first subject portion and the light reflectance of a portion adjacent to the first subject portion is different from a difference between the light reflectance of the second subject portion and the light reflectance of a portion adjacent to the second subject portion. For example, in a case in which the subject portion is a part of the electronic circuit component, it may be regarded that the first subject portion is different from the second subject portion in kind, where there is a difference between the first and second subject portions with respect to a combination of the light reflectance of the subject portion and the light reflectance of the adjacent portion. In a case in which the edge, which is to be acquired, is defined by a contour of the electronic circuit component, it may be regarded that the first subject portion is different from the second subject portion in kind, where there is a difference between the first and second subject portions with respect to a combination of the light reflectance of the electronic circuit component and the light reflectance of a member defining the background. Further, it may be regarded that the first subject portion is different from the second subject portion in kind where there is a difference between the first and second subject portions with respect to a combination of a light reflectance ratio (i.e., ratio between the light reflectance of the subject portion and the light reflectance of the adjacent portion adjacent to the subject portion) and a light reflectance value (i.e., either one the light reflectance of the subject portion and the light reflectance of the adjacent portion).

The control device is configured to control the lighting device and the subject-portion moving device based on the light emission time and movement velocity which have been read from the light-emission-time/movement-velocity memory portion and which are associated with the kind of the subject portion.

The image of the subject portion, which is illuminated for the read light emission time, is taken by the image taking device while the subject portion is being moved at the read movement velocity, for thereby making it possible to acquire the image having brightness suitable for the image processing, and to avoid the amount of the image shake from exceeding a predetermined amount, irrespective of how high or low the light reflectance of the subject portion is.

Further, in the image taking system according to this mode (2), the light-emission-time/movement-velocity memory portion is provided for memorizing the plurality of sets which consist of the plurality of time length values and the plurality of velocity values, and the light-emission-time/movement-velocity reading portion is provided for reading, from the light-emission-time/movement-velocity memory portion, the given light emission time and the given movement velocity which are associated with the obtained kind of the subject portion, so that the control device is configured, during movement of the subject portion by the subject-portion moving device, to cause the lighting device to emit the light for the given light emission time and to cause the image taking device to take the image of the subject portion, and is configured to cause the subject portion to be moved relative to the image taking device at the given movement velocity. Owing to this arrangement, it is possible to make burden of the control device smaller than in an arrangement in which the light emission time and the movement velocity are calculated or determined (rather than being read from a memory portion) upon execution of an image taking operation by the image taking system.

(3) The image taking system according to mode (1) or (2),
wherein the control device includes:
wherein the control device includes:
(d-1) a light-emission-time setting portion configured to set the light emission time to the given light emission time as the one of the plurality of time length values; and
(d-2) a movement-velocity setting portion configured to set the movement velocity to a given movement velocity (as one of the plurality of velocity values) that is based on the given light emission time to which the light emission time is set by the light-emission-time setting portion.

The control device is configured to cause the lighting device to emit the light for the above-described given light emission time to which the light emission time is set by the light-emission-time setting portion, and to cause the subject-portion moving device to move the subject portion relative to the image taking device at the above-described given movement velocity to which the movement velocity is set by the movement-velocity setting portion.

In the image taking system according to this mode (3), the light-emission-time setting portion and movement-velocity setting portion may be configured to set the light emission time and movement velocity, to the given emission time and the given movement velocity, respectively, either prior to execution of the image taking operation (for achieving the object of image-taking) or upon execution of the image taking operation. In the former case, the light-emission-time setting portion and the movement-velocity setting portion may be interpreted to constitute a light-emission-time determining portion configured to determine the given light emission time and a movement-velocity determining portion configured to determine the given movement velocity, respectively, or alternatively, may be interpreted to constitute a light-emission-time determining portion configured to determine each one of the plurality of time length values and a movement-velocity determining portion configured to determine each one of the plurality of velocity values. In the latter case, the light-emission-time setting portion and the movement-velocity setting portion may be interpreted to constitute a light-emission-time reading portion configured to read the above-described given light emission time and a movement-velocity reading portion configured to read the above-described given movement velocity, respectively, or alternatively, may be interpreted to constitute a light-emission-time reading portion configured to read the above-described given light emission time and a movement-velocity determining portion configured to determine the above-described given movement velocity, respectively.

Where the light-emission-time setting portion and movement-velocity setting portion are configured to set the light emission time and movement velocity, to the above-described given light emission time and the above-described given movement velocity, respectively, prior to execution of the image taking operation, the light emission time and movement velocity may be set to the above-described given light emission time and the above-described given movement velocity, based on a picture image that is trially taken by a trial image-taking portion, as in the image taking system according to mode (5) or (6), or without based on the trially taken picture image. The light emission time may be set to the above-described given light emission time, automatically or manually (by an operator), for example, based on configuration, dimension, color and purpose of the subject portion.

(4) The image taking system according to mode (3),
wherein the light-emission-time setting portion includes:
(d-1-i) a light-emission-time memory portion (first memory portion) configured to memorize a plurality of sets each including the given light emission time and a kind of the subject portion, such that the given light emission time and the kind of the subject portion which are memorized in the light-emission-time memory portion are associated with each other;
(d-1-ii) a subject-portion obtaining portion configured to obtain the kind of the subject portion whose image is to be taken by the subject-portion moving device; and
(d-1-iii) a light-emission-time reading portion configured to read, from the light-emission-time memory portion, the given light emission time which is associated with the obtained kind of the subject portion.

The above-described "kind" of the subject portion may be interpreted equally as the "kind" of the subject portion in the above mode (2).

Each of the plurality of time length values memorized in the light-emission-time memory portion may be a value that is obtained based on the trially taken picture image described in mode (5) or (6) or without based on the trially taken picture image.

Each time the movement velocity is required to be set to the given movement velocity (as one of the plurality of velocity values), the movement-velocity setting portion can set the movement velocity to the given light emission time, based on the given light emission time (as one of the plurality of time length values) which is read by the light-emission-time reading portion. This arrangement makes it possible to reduce a required capacity of the memory portion, as compared with an arrangement in which the plurality of velocity values as well as the plurality of time length values are memorized in the memory portion such that each of the memorized plurality of time length values and each of the memorized plurality of velocity values are associated with kind of the subject portion, as in the above mode (2).

(5) The image taking system according to any one of modes (1)-(4), wherein the control device includes (d-1) a trial image-taking portion configured to cause the lighting device to emit the light for a standard emission time (as one of the plurality of time length values), and to cause the subject-portion moving device to move the subject portion relative to the image taking device at a standard movement velocity (as one of the plurality of movement velocity values), for thereby causing the image taking device to trially take the image of the subject portion with emission of the light for the standard emission time during movement of the subject portion at the standard movement velocity, the image taking system comprising:

(e) a display device configured to display a picture image containing the image of the subject portion which has been trially taken by the trial image-taking portion; and (f) a designation input device operable, by an operator, to designate a part of the picture image displayed by the display device, and wherein the control device includes (d-2) a light-emission-time determining portion configured to obtain a value of brightness of the part of the picture image which is designated by the designation input device, and to determine the given light emission time, based on the obtained value of brightness of the part of the picture image.

The above-described "part" of the picture image which is designated by the operator may correspond to either a part of the subject portion or a part of a portion that is other than the subject portion. Where the subject portion is provided by a portion (such as leads of the electronic circuit component) having a high light reflectance, such a portion having the high light reflectance is designated as the designated part by the operator. On the hand, where the subject portion is provided by a dark portion surrounded by a background having a high light reflectance, such a background having the high light reflectance is designated as the designated part by the operator. The designated part is a part, based on which the above-described given light emission time is to be determined such that the designated part is given a suitable value of brightness. In this sense, the designated part may be also referred to as "brightness-value defining part".

The brightness value is a value dependent on the light reflectance of the brightness-value defining part. Therefore, by determining the above-described given light emission time based on the obtained brightness value, the determined given light emission time can be dependent on the light reflectance of the brightness-value defining part, whereby it is possible to acquire an image suitable for the image processing.

In the image taking system according to this mode (5), prior to the image taking operation that is to be executed for achieving the object of image-taking, a trial image-taking operation is executed to trially take the image of the subject portion, and the above-described given light emission time is automatically determined based on the brightness value of the brightness-value defining part that has been obtained by execution of the trial image-taking operation. Thus, the above-described given light emission time can be determined accurately and easily.

Where the image taking system is provided in an electronic-circuit-component mounting machine so as to serve as a component-image taking system, the trial image-taking operation may be executed for all kinds of electronic circuit components that are to be mounted onto a circuit board, or may be executed for a part of the kinds of the electronic circuit components. In the latter case, the image of an electronic circuit component, which is not subjected to the trial image-taking operation, may be taken with the above-described given light emission time that may be a value equal to that for another electronic circuit component which is subjected to the trial image-taking operation and which has similar construction and/or color, or alternatively, may be a value estimated based on that for another electronic circuit component which is subjected to the trial image-taking operation.

(6) The image taking system according to any one of modes (1)-(4), wherein the control device includes (d-1) a trial image-taking portion configured to cause the lighting device to emit the light for a standard emission time (as one of the plurality of time length values), and to cause the subject-portion moving device to move the subject portion relative to the image taking device at a standard movement velocity (as one of the plurality of movement velocity values), for thereby causing the image taking device to trially take the image of the subject portion with emission of the light for the standard emission time during movement of the subject portion at the standard movement velocity, the image taking system comprising:

(e) a display device configured to display a picture image containing the image of the subject portion which has been trially taken by the trial image-taking portion; and (f) a light-emission-time input device operable, by an operator, to input the given light emission time which is determined by the operator based on the picture image displayed by the display device.

In the image taking system according to this mode (6), the operator can determine the above-described given light emission time by himself. As described later in preferred embodiments of the invention, the operator may select one of plural kinds of predetermined light emission times (which are displayed by the display device) as the above-described given light emission time, or alternatively, may determine a suitable light emission time as the above-described given light emission time, in view of the picture image displayed by the display device. In the latter case, the plural kinds of predetermined light emission times as the plurality of time length values are not required to be displayed by the display device. In either of the former and latter cases, the selected or determined one of the predetermined light emission times may be defined as a times of the standard emission time (where "a" may be either larger or smaller than 1).

(7) The image taking system according to mode (5) or (6), wherein the control device includes:

(d-3) a confirmation-image taking portion configured to cause the lightning device to emit the light for the given light emission time, and to cause the subject-portion moving device to move the subject portion relative to the image taking device at a given movement velocity (as one of the plurality of velocity values) which is determined based on the given light emission time, for thereby causing the image taking device to take the image of the subject portion, which has been trially taken by the trial image-taking portion, with emission of the light for the given light emission time during movement of the subject portion at the given movement velocity; and (d-4) an image confirming portion configured to confirm appropriateness of the image taken by the confirmation-image taking portion.

Normally, it is confirmed by the image confirming portion that the image (taken by the confirmation-image taking portion) is appropriate. However, in case of failure of confirmation of appropriateness of the image, the above-described given light emission time could have been inappropriately determined. It is therefore preferable to cause an indicating device to indicate failure of the confirmation, and/or to activate at least one of a buzzer and a lamp, so that an operator can be visually and/or auditorily informed of the confirmation failure by an informing portion that includes at least one of the above-described indicating device, buzzer and lamp.

(8) The image taking system according to mode (7), wherein the image confirming portion includes an edge-acquirability confirming portion configured to confirm that an edge of the subject portion is acquirable by processing the image taken by the confirmation-image taking portion.

(9) The image taking system according to mode (7) or (8), wherein the image confirming portion includes a reliability confirming portion which is configured to obtain a reliability-related value related to a degree of reliability with which an edge of the subject portion is acquirable by processing the image taken by the confirmation-image taking portion, and which is configured to confirm that the reliability-related value is not smaller than a threshold value.

The confirmation of the reliability (with which the edge of the subject portion is normally acquirable by processing the taken image) will be described later in preferred embodiments of the invention.

(10) The image taking system according to any one of modes (7)-(9), wherein the image confirming portion includes a brightness confirming portion which is configured to obtain a value of brightness of a brightness-value defining part of the image whose value of brightness is to be obtained for determining the given light emission time, and which is configured to confirm that the obtained value of brightness is within a threshold range.

It can be confirmed that the above-described given light emission time can be appropriately determined, by confirming that the value of brightness of the brightness-value defining part as a predetermined part of the image is within a threshold range.

(11) The image taking system according to any one of modes (1)-(11),
wherein the control device is configured to control the movement velocity at which the subject portion is moved by the subject-portion moving device such that the amount of the movement of the subject portion for the light emission time is not larger than the predetermined movement amount which is changeable to a plurality of movement amount values that are different from each other, wherein the control device includes:

(d-1) a movement-amount memory portion (second memory portion) configured to memorize a plurality of sets each including the given movement amount and a kind of the subject portion, such that the given movement amount and the kind of the subject portion which are memorized in the movement-amount memory portion are associated with each other;

(d-2) a subject-portion obtaining portion configured to obtain the kind of the subject portion whose image is to be taken by the subject-portion moving device; and (d-3) a movement-amount reading portion configured to read, from the movement-amount memory portion, the given movement amount which is associated with the obtained kind of the subject portion.

In the above mode (2), it is desirable that the "kind" of the subject portion is a category that is distinguishable from another category, in view of the optical properties of both of the subject portion and its contiguous portion. In this mode (11), it is desirable that the "kind" of the subject portion is a category that is distinguishable from another category, in view of a degree of accuracy required in the image processing. That is, the meaning of the "kind" varies depending on how the subject portion is classified, namely, in view of what the subject portion is classified. However, where the subject portion is constituted by an entirety of an electronic circuit component, for example, a model number of the component can serve as means for representing the "kind" of the subject portion. This is because, by knowing the model number of the component, it is possible to know or estimate the optical properties of both of the subject portion and the contiguous portion and also to know or presume whether the degree of accuracy required in processing of the image of the component is high or not. Where the above-described predetermined movement amount is small, it is possible to make the image shake amount small, thereby enabling the image processing to be accurately performed. Where the predetermined movement amount is large, it is possible to move the subject portion by a large distance upon execution of the image taking operation, thereby increasing efficiency of the movement of the subject portion relative to the image taking device. It is therefore possible to improve one of the image processing accuracy and the movement efficiency, which is selected by setting the predetermined movement amount to one of the plurality of movement amount values which is selected depending on the kind of the subject portion. It is noted that the predetermined movement amount may be changeable or variable either in a plurality of steps or without steps. In the latter case, it may be regarded that the predetermined movement amount is variable in an infinite number of steps, and the above-described plurality of movement amount values may be interpreted to mean an infinite number of movement amount values. In either one of the former and latter cases, the predetermined movement amount is changeable such that the predetermined movement amount can be equalized to any one of the plurality of movement amount values that are different from each other.

(12) The image taking system according to any one of modes (1)-(11), wherein the lighting device is constituted by a LED strobe lighting device.

The LED strobe lighting device is controllable such that the light emission time (for which the lighting device is caused to emit the light) is changeable to a desired time length value.

Therefore, the LED strobe lighting device is suitable for use as the lighting device of the image taking system according to the claimable invention.

In general, a LED emits a smaller amount of light than a xenon tube. However, since the above-described given light emission time is determined depending on the light reflectance of the brightness-value defining part (that is provided by the subject portion or its background), it is possible to take the image of the subject portion that is being moved (rather than being stationary) with use of the LED strobe lighting device as the lighting device, without suffering from shortage of amount of light that is required for forming the image. Further, where the subject portion is constituted by an entirety or part of an electronic circuit component, the use of the LED strobe lighting device does not cause the electronic circuit component to be electrically charged, and accordingly avoids the component from being damaged due to electrification of the component. Further, even where the light reflectance of the brightness-value defining part (that is provided by the subject portion or its background) is low, the image of the subject portion can be satisfactorily taken by employing a large one of the time length values (i.e., by increasing the light emission time), without necessity of stopping the movement of the subject portion and without suffering from shortage of amount of light required for the image formation. Thus, even in case of the low light reflectance of the brightness-value defining part, it is possible to restrain reduction in the working efficiency. Still further, the LED strobe lighting device is capable of illuminating the subject portion not only by emitting the light in the form of flashlight but also by continuously emitting the light, so that the use of LED strobe lighting device makes it possible to take the image of the subject portion in any one of various forms.

(13) An electronic-circuit-component mounting machine including:

a board holder configured to hold a circuit board;

a component mounter configured to mount an electronic circuit component onto the circuit board that is held by the board holder;

a component supplier configured to supply the electronic circuit component to the component mounter, whereby the electronic circuit component is received by a component holder of the component mounter;

a component-image taking system configured to take an image of at least a part of the electronic circuit component which is held by the component holder;

an image processor configured to obtain a positional error of the electronic circuit component which is held by the component holder, based on the image taken by the component-image taking system; and a component mounting controller configured to control the component mounter such that the electronic circuit component is mounted onto the circuit board with the positional error being at least reduced, wherein the component-image taking system is provided by the image taking system that is recited in any one of modes (1)-(12).

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 13 is a table showing content stored in an allowable image-shake amount memory that is provided in a RAM of the above-described mounting control computer;

FIG. 14 is a set of tables showing emission time/movement velocity data stored in the RAM of the above-described mounting control computer;

DETAILED DESCRIPTION OF THE PREFERRED EMBODIMENTS

There will be described embodiments of the present invention, by reference to the accompanying drawings. It is to be understood that the present invention is not limited to the embodiments, and may be otherwise embodied with various changes and modifications, such as those described in the foregoing "VARIOUS MODES OF THE INVENTION", which may occur to those skilled in the art.

Figure 1:
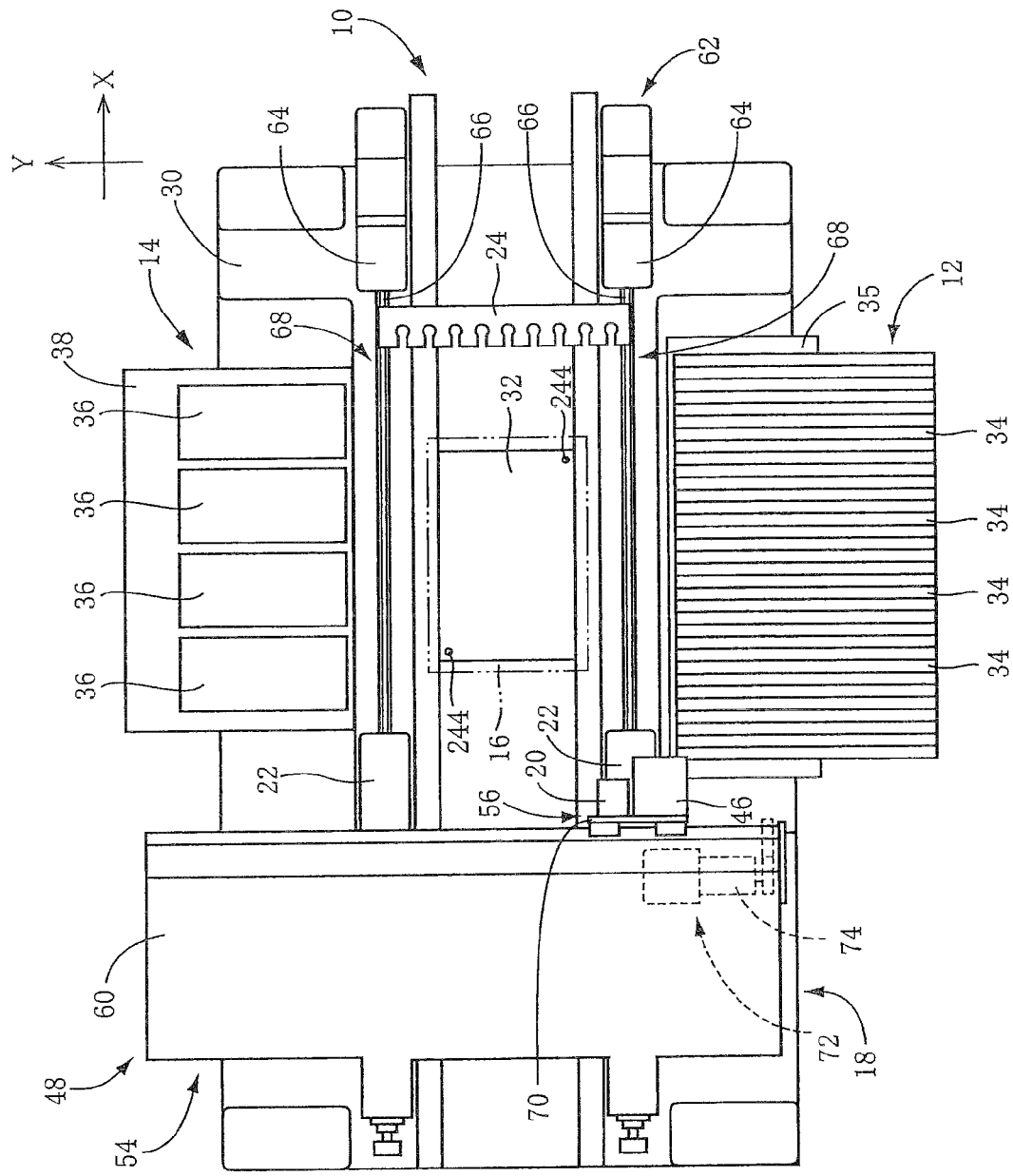
FIG. 1 is a plan view showing an electronic-circuit-component mounting machine constructed according to an embodiment of the invention.

FIG. 1 shows an electronic-circuit-component mounting machine constructed according to an embodiment of the invention. This electronic-circuit-component mounting machine includes: a board conveyor 10; a feeder-type component supplier 12 as a kind of a component supplier; a tray-type component supplier 14 as a kind of the component supplier; a board holder 16; a component mounter 18; a fiducial-mark-image taking unit 20; a pair of component-image taking units 22; a working-head storage device 24 and a control device 26 (see FIG. 10).

The board conveyor 10 is disposed on a bed 30 as a main body of the component mounting machine, and is constituted by, for example, a belt conveyor. This board conveyor 10 is configured to convey a circuit board 32 in a horizontal direction, so as to load and unload the circuit board 32 onto and from the board holder 16. The horizontal direction (hereinafter referred to as "board conveying direction" where appropriate), in which the circuit board 32 is to be conveyed by the board conveyor 10, corresponds to an X-axis direction that is orthogonal to a Y-axis direction on a horizontal plane parallel with a surface (i.e., component mounted surface) of the circuit board 32 held by the board holder 16. The board holder 16 is disposed in a fixed position, and includes a board supporting device (not shown) and a clamping device (not shown), for example, such that the circuit board 32 can be supported at its lower surface by the board supporting device and clamped at its opposite edge portions (that extend in the board conveying direction) by the clamping device. Thus, the circuit board 32, which is loaded onto the board holder 16 and is held by the board holder 16, is kept in a horizontal posture.

As shown in FIG. 1, the feeder-type component supplier 12 and the tray-type component supplier 14 are disposed on respective portions of the bed 30, which are located on respective opposite sides of the board conveyor 10 in the Y-axis direction and each of which is spaced apart from the board conveyor 10 in the Y-axis direction. The feeder-type component supplier 12 includes a plurality of feeders 34 each of which constitutes a kind of component supplying device. The feeders 34 have respective component supplying portions which are arranged in the X-axis direction and which are attached onto a feeder support base 35, such that a multiplicity of electronic circuit components can be supplied from each of the feeders 34 after the components have been sequentially positioned in the corresponding component supplying portion by a feeding device of each of the feeders 34. The tray-type component supplier 14 includes a plurality of trays 36 that are disposed on a tray support base 38, and each of the trays 36 has a multiplicity of accommodation recesses in which electronic circuit components are to be accommodated.

As shown in FIGS. 1 through 4, the component mounter 18 includes a single-nozzle head 40, a multi-nozzle head 42, a chuck head 44, a head holding device 46, a head moving device 48, a head elevating device 50 (serving as an approaching/separating device) and a head rotating device 52. Each of the single-nozzle head 40, multi-nozzle head 42 and chuck head 44 constitutes a component holding head as an example of working head. The single-nozzle head 40, multi-nozzle head 42, head holding device 46, head moving device 48, head elevating device 50 and head rotating device 52 are substantially the same in construction as those disclosed in JP-2006-261325A (corresponding to US 2006-0207090A1).

The head moving device 48 has a X-axis direction moving device 54 and a Y-axis direction moving device 56, as shown in FIG. 1. The X-axis direction moving device 54 includes an X-axis slide 60 as a movable member and an X-axis-slide moving device 62. The X-axis-slide moving device 62 includes a pair of X-axis motors 64 as drive sources and a feed screw mechanism 68 that is constituted by a pair of ball screws 66 and a pair of nuts (not shown) that are held in thread engagement with the respective ball screws 66. The Y-axis direction moving device 56 is disposed on the X-axis slide 60, and includes a Y-axis slide 70 as a movable member and a Y-axis-slide moving device 72. The Y-axis-slide moving device 72 includes a Y-axis motor 74 as a drive source and a feed screw mechanism 76 (see FIG. 2). Each of motors 64, 74 is constituted by, for example, an electric motor in the form of a servo motor with encoder. This servo motor is an electric rotary motor whose angular position and rotational speed are accurately controllable, so that the X-axis slide 60 and Y-axis slide 70 can be positioned in desired positions in the X-axis direction and Y-axis direction, respectively, and can be moved at velocities variable as desired. It is noted that each of the motors 64, 74 may be constituted by a stepping motor in place of the servo motor, or may be constituted by a linear motor in place of the rotary motor.

Figure 2:
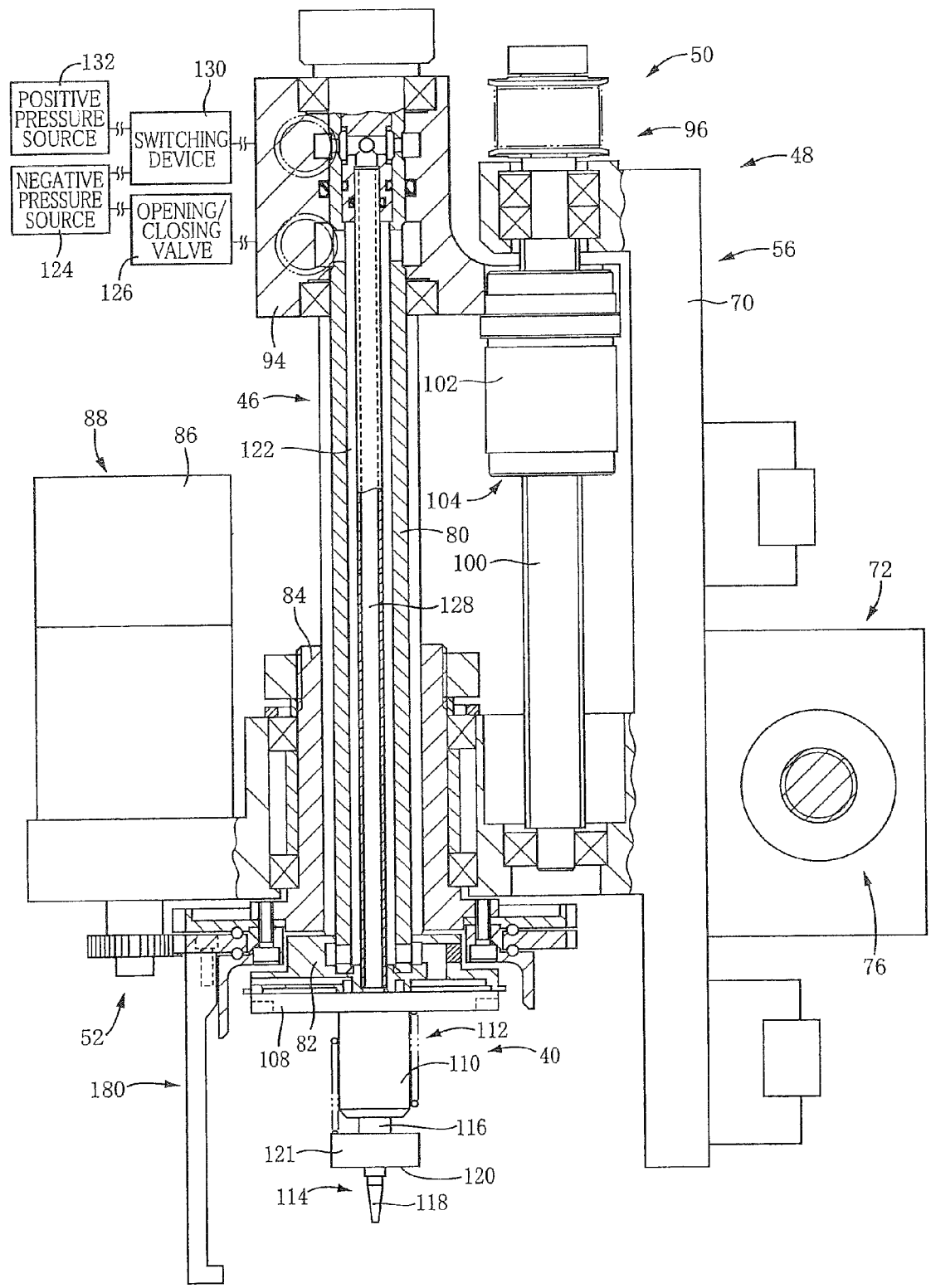
FIG. 2 is a rear view showing, partially in cross section, a state in which a single-nozzle head is held by a head holding device of a component mounter included in the above-described electronic-circuit-component mounting machine.

As shown in FIG. 2, the head holding device 46, head elevating device 50 and head rotating device 52 are disposed on the Y-axis slide 70, so that each of these components can be horizontally moved by movements of the X-axis slide 60 and Y-axis slide 70, so as to be positioned in a desired position. The head moving device 48 constitutes a relative movement device configured to move the head holding device 46 and the board holder 16 relative to each other in directions parallel with the circuit board 32. The head elevating device 50 constitutes a relative movement device in the form of an approaching/separating device configured to move the head holding device 46 and the board holder 16 in directions perpendicular to the circuit board 32 so as to move the head holding device 46 and the board holder 16 toward and away from each other in the perpendicular directions. The head moving device 48 and the head elevating device 50 cooperate with each other to constitute a relative movement device configured to move the head holding device 46 and the board holder 16 relative to each other.

As shown in FIG. 2, the head holding device 46 includes a shaft member 80 as its main body and a head holding portion 82 that is attached to a lower end portion of the shaft member 80. The head holding device 46 is held by the Y-axis slide 70 such that the head holding device 46 is vertically movable relative to the Y-axis slide 70 and rotatable relative to the Y-axis slide 70 about its vertical axis. The head rotating device 52 includes a rotatable body 84 and a rotatable-body driving device 88 that has a drive source in the form of a rotating motor 86 for rotating the rotatable body 84. The rotatable body 84 is unrotatable relative to the shaft member 80, and is axially movable relative to the shaft member 80. With rotation of the rotatable body 84, the head holding device 46 is rotated by a desired angle in forward or reverse direction.

As shown in FIG. 2, the head elevating device 50 includes an elevator member 94 and an elevator-member driving device 96. The elevator member 94 is disposed on the Y-axis slide 70, and is vertically movable relative to the Y-axis slide 70. The above-described shaft member 80 is held at its upper end portion by the elevator member 94 such that the shaft member 80 is rotatable and axially immovable relative to the elevator member 94. The elevator-member driving device 96 has an elevating motor 98 (see FIG. 10) and a feed screw mechanism 104 that includes a ball screw 100 and a nut 102 (held in thread engagement with the screw 100). The elevator member 94 is moved upwardly or downwardly by the elevator-member driving device 96, whereby the head holding device 46 is moved upwardly or downwardly.

As shown in FIG. 2, the single-nozzle head 40 has a main body 112 that includes a base portion 108 and a nozzle holding portion 110. The base portion 108 is sucked and held by the head holding device 46. the single-nozzle head 40 holds a component holder in the form of a single suction nozzle 114 that is configured to suck an electronic circuit component by a negative pressure that is applied to the component. The suction nozzle 114 includes a main body 116, a suction tube 118 and a background defining surface 120 that faces downwardly. The background defining surface 120 is constituted by a lower surface of a background defining member 121 that is provided in the main body 116. The background defining surface 120 has a black color, and provides a background of the electronic circuit component when an image of the component is being taken.

The shaft member 80 of the head holding device 46 defines therein a tubular-shaped or annular-shaped passage 122. The base portion 108 of the single-nozzle head 40 is sucked by a negative pressure that is supplied from a negative pressure source 124 via the annular-shaped passage 122, so that the single-nozzle head 40 is vertically movable and rotatable together with the head holding device 46. An opening/closing valve 126 is provided to selectively allow and inhibit supply of the negative pressure to the passage 122. The shaft member 80 defines therein, in addition to the annular-shaped passage 122, another passage 128 that is substantially aligned with an axis of the shaft member. A switching device 130 is provided to interconnect the passage 128 with a selected one of the negative pressure source 124 and positive pressure source 132, so that the negative pressure or positive pressure is applied to the suction nozzle 110.

Figure 5:
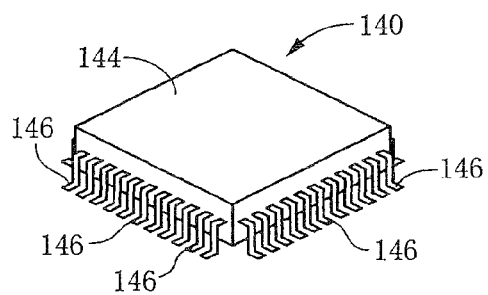
FIG. 5 is a perspective view showing a QFP as an example of an electronic circuit component which is to be mounted onto a circuit board by the above-described single-nozzle head.
Figure 6:
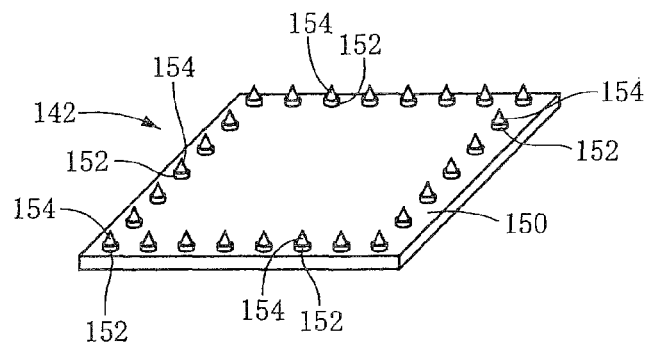
FIG. 6 is a perspective view showing a bear chip as another example of the electronic circuit component which is to be mounted onto a circuit board by the above-described single-nozzle head.

As the electronic circuit component that is to be mounted onto the circuit board 32 by the single-nozzle head 40, there are a QFP (quad flat package) 140 (see FIG. 5) and a bear chip 142 (see FIG. 6), for example. The QFP 140 includes a main body 144 and a plurality of leads 146 as terminals that extend from four side surfaces of the main body 144. The bear chip 142 is an electronic circuit component that is not packaged, and includes a main body 150, a plurality of electrode pads 152 provided on one of opposite surfaces of the main body 150 and a plurality of bumps 154 formed on the respective electrode pads 152. The main body 150 of the bear chip 142 has a surface like a mirror finished surface, so that the surface is represented by a black-color part and each of the bumps 154 is represented by a circular-shaped part in an image that is taken with the light emitted from lateral sides of the bear chip 142.

Figure 3:
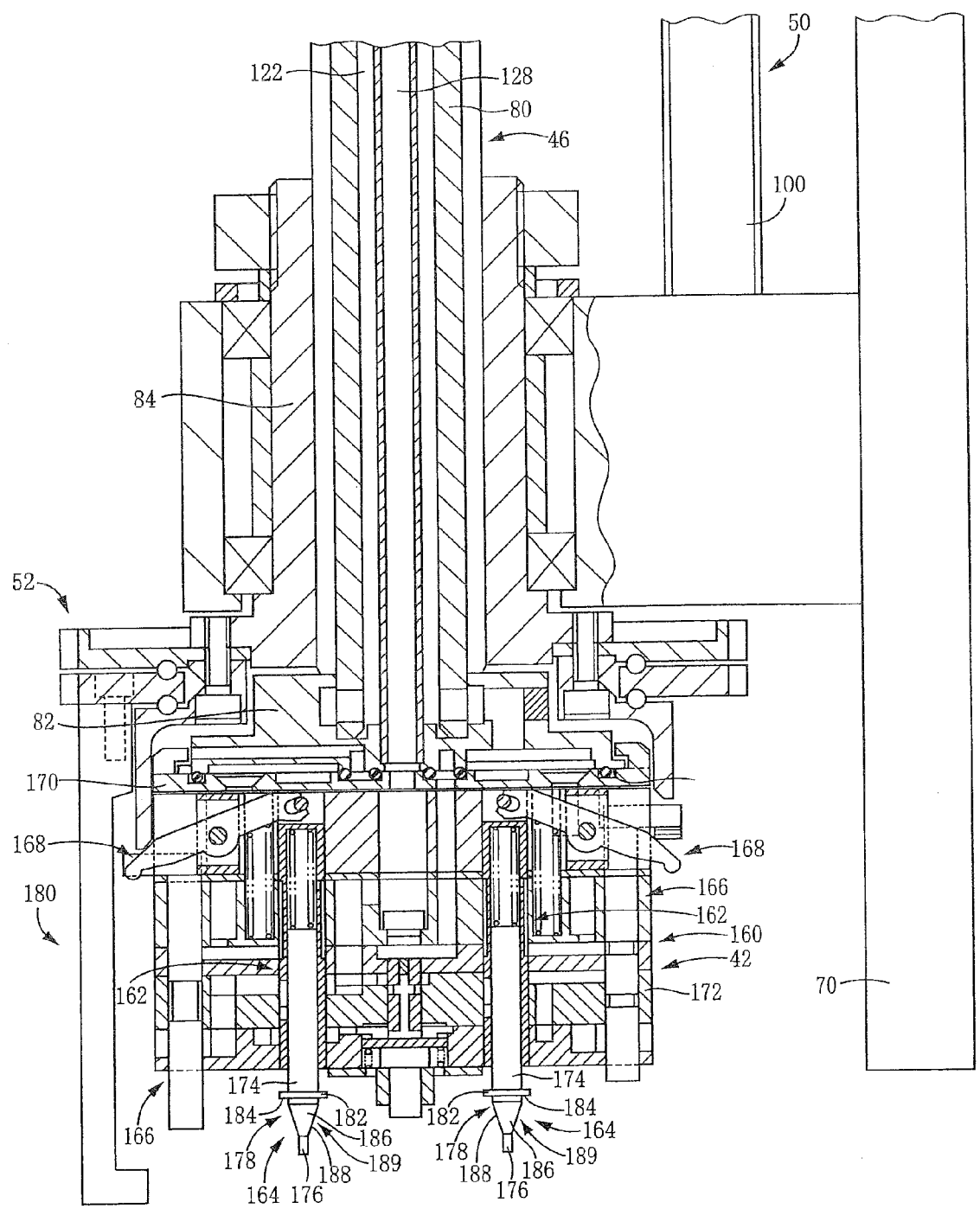
FIG. 3 is a rear view showing, partially in cross section, a state in which a multi-nozzle head is held by the above-described head holding device.

As shown in FIG. 3, the multi-nozzle head 42 has a head main body 160, a plurality of nozzle holding portions 162, a plurality of component holders in the form of suction nozzles 164 provided in the respective nozzle holding portions 162, a plurality of valve devices 166 provided for the respective nozzle holding portions 162, and a plurality of nozzle elevating devices 168 provided for the respective nozzle holding portion 162. The number of the nozzle holding potions 162, which may be three or more, is eight in the present embodiment: The head main body 160 of the multi-nozzle head 42 includes a base portion 170 and a nozzle holding body portion 172, and is sucked and held by the head holding device 46 through a negative pressure, so that the multi-nozzle head 42 is vertically movable and rotatable together with the head holding device 46. The suction nozzles 164 are held by the respective nozzle holding portions 162 that are provided in the nozzle holding body portion 172. Each of the suction nozzles 164 includes a nozzle main body 174, a suction tube 176 and a background defining surface 178 that faces downwardly. A background defining plate 182 is provided in a lower portion of the nozzle main body 174, so as to extend radially outwardly from the lower portion of the nozzle main body 174. A tapered portion 186 is provided between the background defining plate 182 and the suction tube 176, and has a diameter that is linearly reduced as viewed in a downward direction (i.e., direction away from the background defining plate 182 toward the suction tube 176). The background defining surface 178 is constituted by cooperation of a lower surface 184 of the background defining plate 182 and an outer circumferential surface 188 of the tapered portion 186, and has a black color.

For receiving electronic circuit components from the component supplier, the plurality of suction nozzles 164 are sequentially positioned into a component receiving position, by rotation of the multi-nozzle head 42. Each of the nozzle elevating devices 168, when a corresponding one of the suction nozzles 164 is currently positioned in the component receiving position, is operated together with a vertical movement of the multi-nozzle head 42. The corresponding one of the suction nozzles 164 is vertically moved relative to the head main body 160 by operation of the nozzle elevating device 168, and one of the valve devices 166 provided for the above-described corresponding one of the suction nozzles 164 is controlled by a valve switching device 180 so as to be placed in a selected operational state. When receiving the electronic circuit component, a negative pressure is supplied to the above-described corresponding one of the suction nozzles 164 so as to enable this one of the suction nozzles 164 to suck the electronic circuit component.

For mounting the electronic circuit components onto the circuit board 32, each of the suction nozzles 164, when mounting the electronic circuit component onto the circuit board 32, is vertically moved relative to the head main body 160 and the circuit board 32 by a corresponding one of the nozzle elevating devices 168, and a corresponding one of the valve devices 166 is controlled so as to stop supply of the negative pressure to this suction nozzles 164 and start supply of a positive pressure to this suction nozzle 164. It is noted that an angular position (i.e., rotational position) of the electric circuit component (held by each suction nozzle 164) about an axis of the suction nozzle 164 can be changed by rotation of the multi-nozzle head 42 about the axis.

Figure 7:
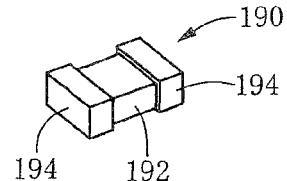
FIG. 7 is a perspective view showing a chip component as an example of an electronic circuit component which is to be mounted onto a circuit board by the above-described multi-nozzle head.

FIG. 7 shows a chip component 190, as an example of the electronic circuit component, which is to be mounted onto the circuit board 32 by the multi-nozzle head 42. The chip component 190 has a main body 192 and two terminals 194 that are provided in respective opposite end portions of the main body 192. It is noted that the multi-nozzle head 42 is capable of mounting not only the chip component 190 but also other electronic circuit components such as a bear chip which is similar to the above-described bear chip 142 and which has a size smaller than the bear chip 142.

Figure 4:
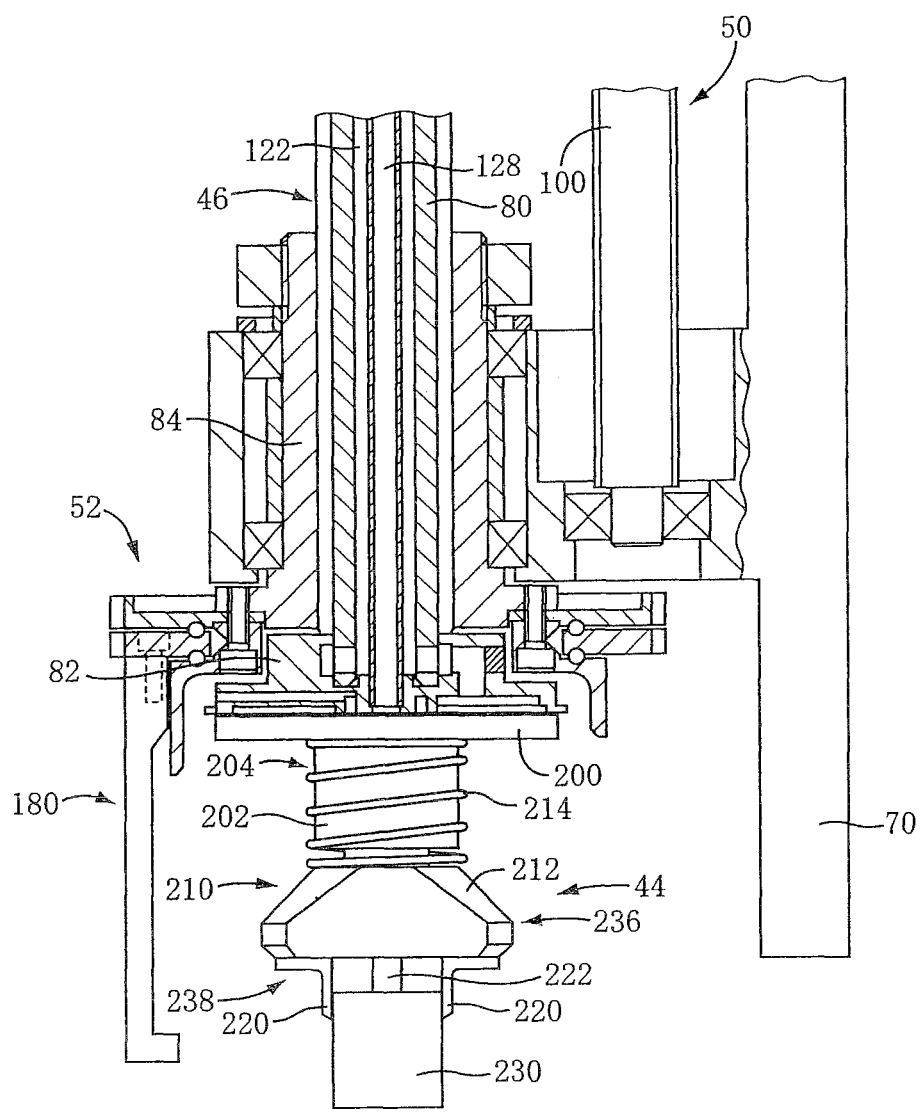
FIG. 4 is a rear view showing, partially in cross section, a state in which a chuck head is held by the above-described head holding device.

As shown in FIG. 4, the above-described chuck head 44 has a head main body 204 including a base portion 200 and a chuck holding portion 202. The chuck head 44 is sucked and held by the head holding device 46 through the negative pressure applied to the chuck head 44, and holds a chuck 210 as a component holder. The chuck 210 has a chuck main body 212 which is fitted with the chuck holding portion 202 such that the chuck main body 212 is movable relative to the chuck holding portion 202 in directions parallel to an axis of the head main body 204. The chuck main body 212 is constantly forced or biased by a compression coil spring 214 as an elastic member that is an example of biasing device, in a direction away from the chuck holding portion 202. The chuck main body 212 is movable by a biasing force applied thereto from the spring 214, by a distance that is limited by a relative-movement limiting device (not shown) disposed between the chuck holding portion 202 and the chuck main body 212.

A pair of jaws 220 as gripping members are disposed on the chuck main body 212, and are movable symmetrically with each other with respect to an axis of the main body 212. The pair of jaws 220 are movable in radial directions perpendicular to the axis of the main body 212, toward and away from each other, by activation of a driving device in the form of an air cylinder (not shown) that is disposed in the chuck main body 212. The air cylinder is a single acting cylinder, so that the pair of jaws 220 are moved toward each other by supply of a compressed air to an air chamber of the cylinder from the head holding device 46, and are moved away from each other by a biasing force applied from a spring that is provided in the air cylinder. The electric circuit component is chucked by the pair of jaws 220 when the jaws 220 have been moved radially toward each other, and is released from the jaws 220 when the jaws 220 have been moved radially away from each other. In FIG. 4, reference sign 222 denotes a stopper or positioning member, which is provided to be brought into contact with the electronic circuit component when the chuck head 44 is moved downwardly. By the contact of the positioning member 222 with the electronic circuit component, the vertical movement of the chuck head 44 toward the component is limited whereby the pair of jaws 220 are precisely positioned in a position, in a vertical direction, which is suitable for chucking the component. In the chuck head 44, the chuck main body 212, pair of jaws 220 and generally disc-shaped base portion 200 cooperate to constitute a background defining member 236, and lower surfaces of the respective chuck main body 212, jaws 220 and base portion 200 cooperate to constitute a background defining surface 238 having a black color.

Figure 8:
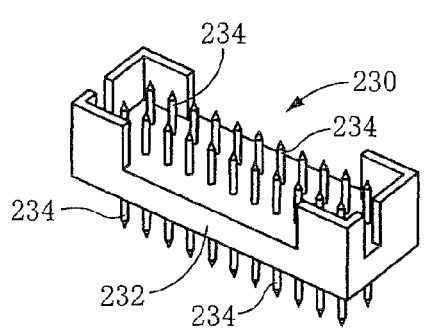
FIG. 8 is a perspective view showing a connector as an example of an electronic circuit component which is to be mounted onto a circuit board by the above-described chuck head.

FIG. 8 shows a connector 230, as an example of the electronic circuit component, which is to be mounted onto the circuit board 32 by the chuck head 44. This connector 230 has a main body 232 and a plurality of pins 234 each of which penetrates through the man body 232 and extends in a thickness direction of the main body 232. The main body 232 has a gray color.

The working-head storage device 24 stores therein component holding heads in the form of various kinds of single-nozzle heads 40, various kinds of multi-nozzle heads 42 and chuck head 44. Each kind of the single-nozzle head 40 is adapted to hold a corresponding one of various kinds of the suction nozzles 114. That is, the kind of the single-nozzle head 40 varies depending on the kind of the suction nozzle 114 that is be held by the same nozzle head 40. Each kind of the suction nozzle 114 has a suction tube whose shape and size are dependent on a corresponding one of various kinds (each of which is defined by the corresponding model number, for example) of the electronic circuit components. That is, the kind of the suction nozzle 114 varies depending on the kind of the component that is to be sucked by the same suction nozzle 114. Each kind of the multi-nozzle head 42 is adapted to hold a certain number of a corresponding one of various kinds of the suction nozzles 164. That is, the kind of the multi-nozzle head 42 varies depending on at least one of the kind and number of the suction nozzles 164 that are to be held by the same nozzle head 42. The head holding device 46 is moved to the working-head storage device 24, so as to catch one of the component holding heads which is to be used to mount the electronic circuit components onto the circuit board 32. Hereinafter, the term "component holding head" will be used for representing one of the single-nozzle head 40, multi-nozzle head 42 and chuck head 44, as long as the description is common to the heads 40, 42, 44 and can be made without specifying which one of the heads 40, 42, 44 is held by the head holding device 46.

The above-described fiducial-mark-image taking unit 20 is mounted on the Y-axis slide 70, as shown in FIG. 1, and is horizontally movable together with the head holding device 46 so as to be positioned in a desired position. In this sense, the head moving device 48 having the X-axis direction moving device 54 and Y-axis direction moving device 56 serves as a fiducial-mark-image-taking-unit moving device, and cooperates with the fiducial-mark-image taking unit 20 to constitute a fiducial-mark-image taking system. The fiducial-mark-image taking unit 20 has a CCD camera 240 (constituting at least a part of a mark-image taking device) and a lighting device 242 (see FIG. 10), and is configured to take an image of a subject portion such as a fiducial mark 244 (see FIG. 1) which is provided on a circuit board, from an upper side of the circuit board.

Figure 9:
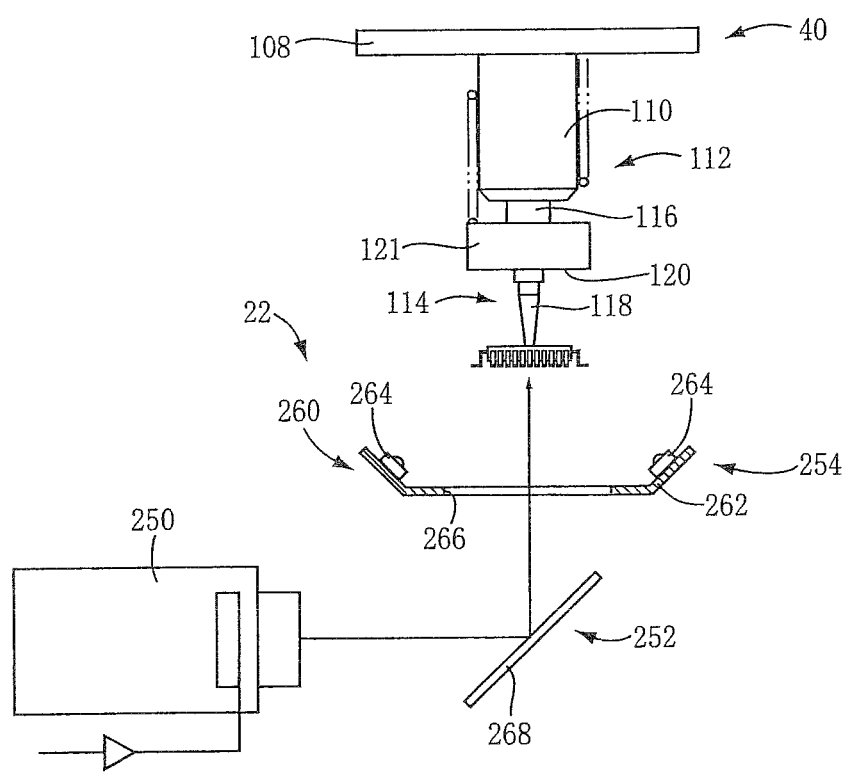
FIG. 9 is a front view showing, partially in cross section, a component-image taking unit that is included in the above-described electronic-circuit-component mounting machine.

The above-described pair of component-image taking units 22 are provided on respective portions of the X-axis slide 60 each of which is located between a corresponding one of the component suppliers 12, 14 and the board holder 16, as schematically shown in FIG. 1, such that the component-image taking units 22 are movable together with the component holding head and a subject portion (whose image is to be taken by an image taking device) in the X-axis direction. The X-axis direction moving device 54 serves as a component-image-taking-unit moving device as an image-taking-unit moving device. As shown in FIG. 9, each of the component-image taking units 22 has a CCD camera 250, a light guide device 252 and a lighting device 254, wherein the CCD camera 250 and the light guide device 252 cooperate with each other to constitute a surface-image taking device as an example of the image taking device. The CCD camera 250 is capable of taking images of all the electronic circuit component, together with each other, which are sucked by the respective suction nozzles 164 held by the respective nozzle holding portions 162 of the multi-nozzle head 42. In the present electronic-circuit-component mounting machine, the camera 250 is configured to take, as the image of each electronic circuit component, a frontal image rather than a silhouette image. When taking the image of each electronic circuit component, the image taking device constituted by the CCD camera 250 and the light guide device 252 is positioned on a lower side of the electronic circuit component. Thus, the image is taken from the lower side of the component, i.e., from one of opposite sides of the component which is remote from the suction nozzle 114, 164 or chuck 210, so that the image of the subject portion can be taken even where the subject portion (like the bumps 154 of the bear chip 142) overlaps with the other portion (like the main body 150 of the bear chip 142) in a direction perpendicular to an axis of the electronic circuit component (i.e., axis of the suction nozzle 114).

As shown conceptually in FIG. 9, the lighting device 254 is constituted by a LED strobe lighting device 260, and includes a main body 262 and a plurality of LEDs 264 provided in the main body 262. The main body 262 of the lighting device 254 has a through-hole or aperture 266 that is formed through a central portion of the main body 262. The LEDs 264 are arranged in a circular line that surrounds the aperture 266 such that each of the LEDs 264 takes a posture causing flashlight to be emitted therefrom in an inclined direction that is inclined with respect to a center line of the aperture 266. The lighting device 254 is disposed such that the center line of the aperture 266 is held in parallel with an axis of the component holding head (such as the single-nozzle head 40, multi-nozzle head 42 and chuck head 44) and a vertical direction of the electronic-circuit-component mounting machine. In this arrangement, when the flashlight is emitted from each of the LEDs 264, the emitted flashlight is directed in a diagonally upward direction so that an object (that is to be subjected to flashlight emission or illuminated) is generally illuminated from its lateral sides by the LED strobe lighting device 260. An amount of light emittable from the LED strobe lighting device 260 for a certain length of time is constant. However, a light emission time of the LED strobe lighting device 260 is variable without steps, so that the lighting device 254 as a whole is capable of changing the light emission time such that the light emission can be equalized to any one of a plurality of time length values that are different from each other. The light guide device 252, which cooperates with the CCD camera 250 to constitute the image taking device, has a reflector plate 268, and is disposed below the LED strobe lighting device 260, so as to change a direction of an image forming light as a reflected light reflected from the electronic circuit component such that the reflected light is caused to enter the CCD camera 250.

The image taking device (which is constituted by the CCD camera 250 and the light guide device 252) of each of the two component-image taking units 22 disposed on the X-axis slide 60 is opposed to the component holding head carried by the Y-axis slide 60 in the vertical direction that is orthogonal to the X-axis direction and Y-axis direction. With movement of the component holding head together with the Y-axis slide 60 in the Y-axis direction, the component holding head is moved relative to the image taking device in a direction orthogonal to the vertical direction, i.e., an opposed direction in which the image taking device and the component holding head (or the subject portion held by the component holding head) are opposed to each other. Thus, in the present embodiment, the Y-axis direction moving device 56 serves also as a subject-portion moving device.

Figure 10:
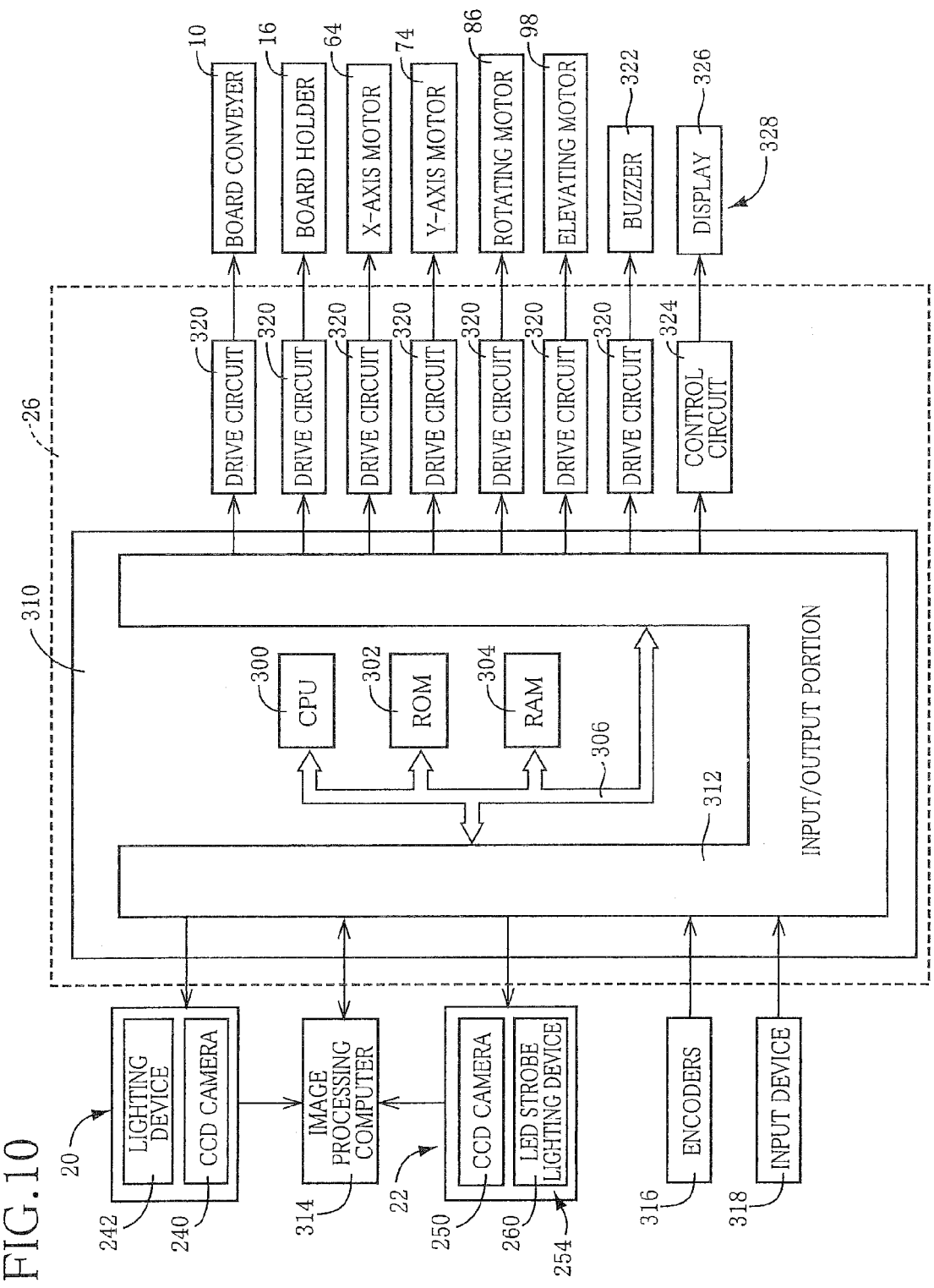
FIG. 10 is a block diagram conceptually showing a control device configured to control the above-described electronic-circuit-component.

As shown in FIG. 10, the control device 26 is constituted principally by a mounting control computer 310 that includes a CPU 300, a ROM 302, a RAM 304, a bus 306 (interconnecting the CPU 300, ROM 302 and RAM 304) and an input/output portion 312. To the input/output portion 312, there are connected an image processing computer 314 (configured to process image data acquired by the CCD cameras 240, 250), encoders 316 and an input device 318. The encoders 316, which are connected to the input/output portion 312, are provided in respective servo motors constituting most of drive sources of various devices that are included in the present electronic-circuit-component mounting machine. To the input/output portion 312, there are also connected the above-described fiducial-mark-image taking unit 20 and component-image taking units 22, whereby the above-described CCD cameras 240, 250 and lighting devices 242, 254 are controllable by the control device 26.

To the input/output portion 312, there are further connected a buzzer 322, a display 326 and various drive sources such as the X-axis motors 64 and Y-axis motor 74 of the head moving device 48. The buzzer 322 and the various drive sources are connected to the input/output portion 312 via respective drive circuits 320. The display 326 is connected to the input/output portion 312 via a control circuit 324. The display 326 cooperates with the control circuit 324 to constitute an indicating device 328, and is configured to display various data, for example. The input device 318 may include a keyboard and a pointing device (e.g. mouse) such that data and commands can be inputted into the control device 26 through the keyboard and the pointing device, or may include the above-described display 328 such that data and commands can be inputted into the control device 26 by touching the display 328 where the display 328 is constituted by a touchscreen. The ROM 302 stores therein various routines, programs and data such as a main routine (not shown), a component mounting program (not shown), a light-emission-time/movement-velocity determining routine (represented by flow chart of FIG. 11) and a component mounting routine (represented by flow chart of FIG. 12). The component mounting program contains data representing: various kinds of electronic circuit components that are to be mounted onto the circuit board 32; order in which the electronic circuit components are to be mounted onto the board 32; X-Y coordinate values of mount portions of the board 32 onto which the electronic circuit components are to be mounted; position of a corresponding one of the feeders 34 or trays 36 from which each of the electronic circuit components is to be supplied; and kind of a corresponding one of the component holding heads by which each of the electronic circuit components is to be held. It is noted that, in the component mounting program, the kind of each of the electronic circuit components is represented by, for example, its model number.

In the electronic-circuit-component mounting machine constructed as described above, one of the above-described component holding heads (i.e., the single-nozzle head 40, multi-nozzle head 42 and chuck head 44), which is selected depending on the kind of each of the electronic circuit components (that is represented by its model number) to be mounted onto the circuit board 32, is held by the head holding device 46 so that each electronic circuit component is mounted by the selected one of the component holding heads onto the circuit board 32. Since each of the component-image taking units 22 is disposed on the X-axis slide 60, each component-image taking unit 22 is moved together with the selected component holding head in the X-axis direction. Irrespective of which one of the component holding heads is selected for mounting each electronic circuit component onto the circuit board 32, after having received the electronic circuit component from the component supplier 12 or 14, the selected component holding head holding the electronic circuit component is moved toward the board holder 16 by at least the Y-axis direction moving device 56. During movement of the component holding head toward the board holder 16 in a direction containing component parallel to the Y-axis direction, an image of the electronic circuit component is taken by the CCD camera 250, without the movement of the component holding head being stopped. That is, the image of the electronic circuit component is taken by a corresponding one of the component-image taking units 22 when the component passes over the corresponding component-image taking unit 22 during the movement of the component holding head relative to the corresponding component-image taking unit 22 in the above-described direction containing the component parallel to the Y-axis direction. It is noted that this direction of the movement of the component holding head relative to the corresponding taking unit 22 may contain a component parallel to the vertical direction in addition to the component parallel to the Y-axis direction.

The image of the electronic circuit component is taken for the purpose of, for example, checking if the component is held by the component holder such as the suction nozzles 114, 164 and chuck 210, checking if the kind (model number) of the component actually held by the component holder correctly corresponds to a desired kind (model number) and checking if there is a positional error of the component held by the component holder. The positional error is represented by a deviation of an actual position of the component from a desired position of the component in the X-axis direction and Y-axis direction and also a deviation of an actual angular position of the component from a desired angular position of the component about the axis of the component (i.e., axis of the component holder). With the positional error being corrected or at least reduced, namely, with the deviations being compensated or at least reduced, the component can be accurately mounted onto a desired mount portion of the circuit board 32, with its accurate posture. According to this arrangement, if the component is not held by the component holding head, or if the kind of the actually held component does not correctly correspond to the desired kind, an operation for receiving the component from the component supplier 12 or 14 is repeated.

For achieving the above-described purpose of checking the presence of the component held by the component holder, the kind of the actually held component and the positional error of the held component, an edge of the component, i.e., a part of the image of the component that is to be processed, is acquired, whereby a part of the image formed in the CCD camera 250, whose position is to be calculated, is determined. Where the component is the QFP 140, the edge of the component is defined by the leads 146, so that the leads 146 constitute the subject portion and an image of the leads 146 constitutes the above-described part of the image that is to be processed. Where the component is the bear chip 142, the edge of the component is defined by the bumps 154, so that the bumps 154 constitute the subject portion and an image of the bumps 154 constitutes the above-described part of the image that is to be processed. Where the component is the chip component 190, the edge of the component is defined by the terminals 194, so that the terminals 194 constitute the subject portion and an image of the terminals 194 constitutes the above-described part of the image that is to be processed. Where the component is the connector 230, the edge of the component is defined by the main body 232, so that the main body 232 constitutes the subject portion and an image of the main body 232 constitutes the above-described part of the image that is to be processed. Each of these subject portions is a part of the component. Thus, the entire image of the component is taken by the CCD camera 250, and the part of the entire image is acquired as the image of the subject portion.

Since the image of the subject portion is taken during movement of the electronic circuit component, the taken image is inevitably shaken. In general, the more accurately the image processing can be performed, the less an amount of shake of the image is. However, there is a case in which any inconvenience is not caused even by a relatively large amount of shake of the image, where the accuracy required for the image processing is not so high. For example, where the QFP 140 is to be mounted onto the circuit board 32, the multiplicity of leads 146 have to be positionally aligned with respective lands provided in respective mounted portions of the circuit board 32, the image processing has to be performed with high accuracy, thereby requiring the positional error of the QFP 140 as the electronic circuit component to be measured or obtained accurately. For accurately obtaining the positional error, the amount of shake of the image has to be small. On the other hand, where the chip component 190 having the small number of terminals 194 is to be mounted on the circuit board 32, or where each of the lands provided in the circuit board 32 has a size that is large as compared with a corresponding one of terminals of the electronic circuit component, it is not necessary to correct the positional error of the component with high accuracy. That is, in such a case where there is a low risk of failure in connection of each terminal with the corresponding land even if the electronic circuit component is not mounted precisely onto a desired position in the circuit board 32, the accuracy required for the image processing is not so high, so that the amount of shake of the image may be somewhat large.

The electronic circuit component is illuminated by the flashlight emitted from the LED strobe lighting device 260, while the image of the component is being taken by the CCD camera 250. In this instance, a certain amount of the image forming light has to be inputted into the CCD camera 250, for enabling the image of the subject portion to be clearly formed in the CCD camera 250 and enabling the image processing to be satisfactorily performed. To this end, a part of the electronic circuit component is designated as a brightness-value defining part that serves as a part based on which the light emission time of the LED strobe lighting device is determined such that the designated brightness-value defining part is given a suitable value of the brightness. Where the light reflectance of the subject portion is higher than the light reflectance of the other portion, it is common that the subject portion is assigned as the brightness-value defining part. Where the light reflectance of the subject portion is lower than the light reflectance of the peripheral portion (surrounding the subject portion), it is common that the peripheral portion is assigned as the brightness-value defining part. In either one of these cases, the light emission time of the LED strobe lighting device is made long where the light reflectance of the brightness-value defining part is low, for obtaining a required amount of the image forming light. The amount of shake of the image is increased with increase of the light emission time as long as the movement velocity of the subject portion relative to the image taking device is not changed.

In the present electronic-circuit-component mounting machine, an allowable amount of shake of the image of the subject portion is determined for each of various kinds of the electronic circuit components. The light emission time is determined depending on the light reflectance of the brightness-value defining part, while the movement velocity (upon taking of the image of the electronic circuit component with emission of the flashlight from the LED strobe lighting device 260) is determined such that an actual amount of shake of the image corresponds to the allowable amount of the shake of the image. According to this arrangement, the image processing is performed accurately for the subject portion in the form of the electronic circuit component which requires the positional error to be accurately obtained, thereby making it possible to accurately obtain the positional error irrespective of whether the light reflectance of the subject portion is high or low. Since the component-image taking units 22 are disposed on the X-axis slide 60, the movement velocity of the subject portion relative to the image taking device is represented by a movement velocity at which the component holding head is to be moved in the Y-axis direction while the image of the electronic circuit component is being taken by the image taking device.

FIG. 13 shows, by way of examples, the allowable image-shake amounts each of which is determined for a corresponding one of kinds of the subject portion (that corresponds to the brightness-value defining part in the present embodiment). In FIG. 13, the various kinds of the subject portions are represented by the respective kinds of the electronic circuit components that include the respective various kinds of the subject portions. The RAM 304 has an allowable image-shake amount memory that memorizes each of the kinds of the electronic circuit components such that each of the memorized kinds of the components is associated with a corresponding one of the allowable image-shake amounts. In the present electronic-circuit-component mounting machine, plural kinds of allowable image-shake amounts (e.g., three kinds of allowable image-shake amounts) are determined, and three combinations each consisting of the light emission time and the movement velocity are determined for each of the three kinds of allowable image-shake amounts, as shown in FIG. 14. The RAM 304 has a light-emission-time/movement-velocity determining data memory that memorizes the three combinations that are determined for the respective three kinds of allowable image-shake amounts, namely, memorizes a plurality of time length values and a plurality of velocity values such that each of the memorized plurality of time length values and each of the memorized plurality of velocity values are associated with kind of the subject portion.

It is noted that the kinds of the subject portions shown in FIG. 13 may be considered as kinds of the electronic circuit components into which the components are roughly classified, so that each of the allowable image-shake amounts is determined for a corresponding one of the roughly classified kinds of the components in case shown in FIG. 13. However, an allowable image-shake amount may be determined for each model number of the component or for each of kinds of the components into which the components are more finely classified. It is further noted that each allowable image-shake amount indicated in FIG. 14 is merely an example and may be modified as needed.

The above-described three combinations, which are determined for each of the three kinds of allowable image-shake amounts, are prepared for respective three levels of the light reflectance, i.e., the high light reflectance, standard reflectance and low reflectance. The light emission time (time length value) of each of the three combinations is a time length value that is determined depending on a corresponding level of the light reflectance. The time length value determined as a given light emission time is made small whereby an exposure factor is set to a low value, where the corresponding light reflectance is high. The time length value determined as the given light emission time is made large whereby the exposure factor is set to a high value, where the corresponding light reflectance is low. It is therefore possible to acquire an amount of the image forming light which provides the image with a brightness value suitable for the image processing. The allowable image-shake amount corresponds to an allowable amount of movement of the subject portion relative to the image taking device upon taking of the image for the light emission time, and can be obtained as a product of the movement velocity (of the subject portion relative to the image taking device) and the light emission time. The given movement velocity can be obtained based on the allowable image-shake amount and the given light emission time. The given movement velocity is made low when the given light emission time is long, thereby making it possible to avoid an actual image-shake amount from exceeding the allowable image-shake amount, even when the given light emission time is considerably long.

Although the light reflectance is classified into the three levels in the present embodiment, the light reflectance may be classified into more than three levels. In this case, at least one of the largest time length value and smallest time length values may be made sill larger or smaller than that shown in FIG. 14. Further, the time length values for the respective three levels of the light reflectance may be different form those shown in FIG. 14, and may be changed as needed.

Further, upon determination of the light emission time based on the light reflectance of the brightness-value defining part, this determination may be made by also taking account of a camera gain of the CCD camera 250. Where the camera gain is a variable value, the determined camera gain as well as the determined light emission time and movement velocity may be included in control parameters.

In the present electronic-circuit-component mounting machine, prior to a component mounting operation for mounting the electronic circuit components onto the circuit board 32, one of the combinations is selected for the brightness-value defining part of each of the various kinds of the electronic circuit components, such that the light emission time (time length value) and the movement velocity (velocity value) of the selected combination are used for taking the image of each of the kinds of the components. The kinds of the electronic circuit components correspond to the kinds of the components for each of which the allowable image-shake amount is determined as shown in FIG. 13. The light emission time (time length value) and the movement velocity (velocity value) of each combination are determined based on the image of the electronic circuit component that is actually held by the component holding head, which image is taken by the CCD camera 250 with emission of the flashlight from the LED strobe lighting device 260 for a standard emission time while the component holding head is being moved relative to the component-image taking unit 22 at a standard movement velocity. The standard emission time is an intermediate one of the three time length values which are determined for a corresponding one of the three kinds of allowable image-shake amounts. The standard movement velocity is an intermediate one of the three velocity values which are determined for the corresponding one of the three kinds of allowable image-shake amounts. There will be described execution of the light-emission-time/movement-velocity determining routine of FIG. 11 in each of cases where the QFP 140, bear chip 142, chip component 190 and connector 230 are to be mounted onto the circuit board 32.

Figure 11:
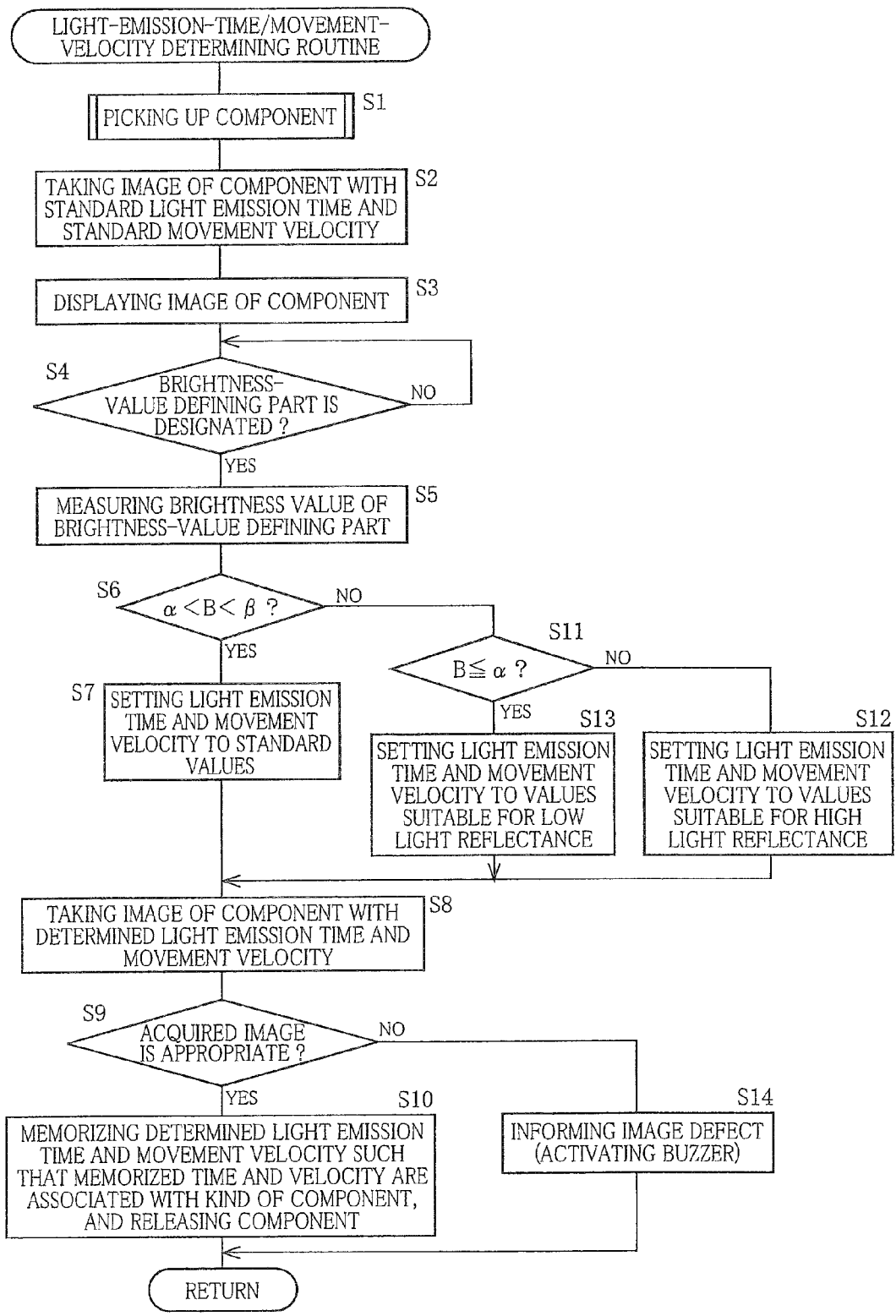
FIG. 11 is a flow chart showing a light-emission-time/movement-velocity determining routine stored in a ROM of a mounting control computer that constitutes a main portion of the above-described control device.

There will be first described a process of determination of the light emission time and the movement velocity according to the determining routine of FIG. 11, in the case where the QFP 140 (see FIG. 5) is to be mounted onto the circuit board 32. In this case, the single-nozzle head 40 as one of the component holding heads is held by the head holding device 46. The light-emission-time/movement-velocity determining routine of FIG. 11 is initiated with step S1 in which the single-nozzle head 40 is moved by the head moving device 48 in at least one of the X-axis direction, Y-axis direction and vertical direction, so as to reach the feeder-type component supplier 12 and pick up the QFP 140 from one of the plurality of feeders 34. After the QFP 140 has been picked up by the single-nozzle head 40, step S2 is implemented to execute a trial image-taking operation. In this step S2, the single-nozzle head 40 is moved by the Y-axis direction moving device 56 in the Y-axis direction toward the board holder 16, whereby the single-nozzle head 40 is caused to pass over the LED strobe lighting device 260, and an image of the QFP 140 is taken by the CCD camera 250.

In this instance, the single-nozzle head 40 is moved at the standard movement velocity, and the image of the QFP 140 is taken by the CCD camera 250 with flashlight being emitted from the LED strobe lighting device 260 during the movement of the single-nozzle head 40 at the standard movement velocity. The allowable image-shake amount is set to 25 μm for the QFP 140, as shown in FIG. 13, so that the standard movement velocity is set to 0.625 m/s while the standard emission time is set to 40 μs, as shown in an uppermost one of the tables of FIG. 14. The emission of the flashlight by the LED strobe lighting device 260 and the taking of the image of the electronic circuit component by the CCD camera 250 are controlled by the mounting control computer 310, such that the emission of the flashlight by the LED strobe lighting device 260 is initiated while an accumulation of electrical charge into a CCD of the CCD camera 250 is initiated by activation of an electronic shutter when the single-nozzle head 40 reaches a position that enables the image of an entirety of the QFP 140 to be formed on an image forming surface of the CCD camera 250, and such that the emission of the flashlight and the accumulation of the electric charge are terminated whereby the taking of the image is completed when the given or determined light emission time (i.e., selected one of the time length values) has elapsed from the initiation of the emission of the flashlight. Data representing the taken image is processed by the image processing computer 314, and the processed data is supplied to the mounting control computer 310. Then, in step S3, the image of the entirety of the QFP 140 is displayed on the display 326 of the indicating device 328.

Referring to the image of the QFP 140 displayed on the display 326, an operator of the electronic-circuit-component mounting machine designates, as the brightness-value defining part, a part of the electronic circuit component. Step S4 is then implemented to judge whether the brightness-value defining part has been designated or not. This step S4 is repeatedly implemented until an completion of designation of the brightness-value defining part is inputted. When the designation has been completed, a positive decision (YES) is obtained in step S4, and then step S5 is implemented to measure or calculate the brightness value B of the brightness-value defining part.

Then, in step S6, it is judged whether the brightness value B of the brightness-value defining part designated by the operator is higher than a predetermined value α and lower than a predetermined value β. Since the brightness value of the brightness-value defining part is increased with increase of the light reflectance of the brightness-value defining part, namely, with increase of an amount of the reflected light, i.e., an amount of the image forming light, it is possible to know the light reflectance of the brightness-value defining part, based on the brightness value of the brightness-value defining part. The predetermined values α, β are set to respective values which make it possible to classify, based on the brightness value of the brightness-value defining part acquired by the taking of the image with the standard emission time and standard movement velocity, the light reflectance of the brightness-value defining part into three levels (i.e., high, standard and low levels) which correspond to the above-described three time length values determined for the allowable image-shake amount of 25 μm.

Where the leads 146 of the QFP 140 are designated as the brightness-value defining part by the operator, the brightness value B of the leads 146 is calculated. Specifically described, one of the leads 146 is designated as the brightness-value defining part, and the brightness value of the designated one of the leads 146 is calculated. Since the light reflectance of each lead 146 of the QFP 140 is a standard value, the brightness value B is higher than the predetermined value α and lower than predetermined value β, so that a positive decision (YES) is obtained in step S6 whereby the control flow goes to step S7. In step S7, the standard one of the time length values and the standard one of the velocity values are respectively selected as the given light emission time and movement velocity. That is, since the allowable image-shake amount with respect to the QFP 140 is 25 μm, the time length value and the velocity value of a standard one of the three combinations (determined for the allowable image-shake amount of 25 μm) are determined as the given light emission time and the movement velocity for the QFP 140. In other words, the light emission time and the movement velocity are set to the standard one of the time length values and the standard one of the velocity values, respectively.

Then, in step S8 that is implemented to execute a confirmation image-taking operation, the image of the QFP 140 is taken again with the determined light emission time and movement velocity. Where the leads 146 are designated as the brightness-value defining part by the operator, the light emission time and the movement velocity are set to the respective standard values, so that the image of the QFP 140 is taken again with the same condition as in step S2 and data representing the taken image is processed by the image processing computer 314. In this instance, the taken image is processed in the same manner as when the QFP 140 is actually mounted onto the circuit board 32, for calculating the positional error of the QFP 140 held by the suction nozzle 114. Specifically described, the edges of the respective leads 146 of the QFP 140 are obtained whereby actual positions of the respective leads 146 are obtained based on the obtained edges, and an actual position of the QFP 140 is obtained based on the obtained positions of the respective leads 146 whereby the positional error of the QFP 140 is calculated. In this respect, if the positional error of the QFP 140 can be obtained through the image processing, it can be regarded that the light emission time and the movement velocity were appropriately determined. That is, if the image of the leads 146 has a sufficient contrast against the image of its background which is defined by the background defining surface 120 of the single-nozzle head 40 having a black color, the image of the leads 146 has a brightness value required for obtaining the edges through the image processing whereby it can be regarded that the light emission time and the movement velocity were set to respective appropriate values. Data indicative of whether the positional error of the QFP 140 held by the suction nozzle 114 has been obtained or not as a result of the image processing, is supplied from the image processing computer 314 to the mounting control computer 310, so that step S9 is implemented to judge, based on the supplied data, whether the acquired image is appropriate or not.

The light emission time and the movement velocity could be set to inappropriate values, for example, where a wrong part (other than the leads 146) is erroneously designated as the brightness-value defining part by the operator who sees the image of the QFP 140 displayed on the display 326. In such a case, the image of the leads 146 could not be provided with a brightness value suitable for the image processing, resulting in failure in obtaining the positions of the leads 146 and failure in calculating the positional error of the QFP 140. In the event of such a case, data indicative of the failures is supplied from the image processing computer 314 to the mounting control computer 310. In step S9, it is judged whether the positional error is calculated or not, and it is judged that the acquired image is not appropriate if the positional error is not calculated. Thus, in absence of calculation of the positional error, a negative decision (NO) is obtained in step S9, and the control flow goes to step S14 in which the operator is informed of the defect of image by activation of the buzzer 322 and the image defect is indicated on the display 326. In this case, the operator identifies a possible factor causing the image defect, and takes a necessary procedure such as redetermination of the light emission time and movement velocity.

Where the image is satisfactorily processed without defect of the image and the positional error of the QFP 140 is obtained, data representing the positional error is supplied from the image processing computer 314 to the mounting control computer 310, so that a positive decision (YES) is obtained in step S9 whereby step S10 is implemented for releasing the QFP 140. In this step S10, the single-nozzle head 40 is moved to a component storage (not shown) disposed within a movement area (in which the single-nozzle head 40 as the component holding head is movable by the head moving device 48), and is operated to release the QFP 140 such that the released QFP 140 is stored in the component storage. Further, in this step S10, the determined emission time and movement velocity are memorized in a light-emission-time/movement-velocity memory that is provided in the RAM 304 of the mounting control computer 310, such that the memorized emission time and movement velocity are associated with a corresponding one of the kinds of the electronic circuit component (into which the components are roughly classified as shown in FIG. 13). It is noted that the component storage may be replaced with a mounting-failure component collecting conveyor, so that the QFP 140 is collected by the collecting conveyor if the QFP 140 fails to be mounted onto the circuit board 32.

An image processing program, which is used by the image processing computer to process the image of the electronic circuit component that is acquired for confirmation purpose, is preferably arranged to calculate, in addition to the positional error of the component, at least one of reliability-related values each related to a degree of reliability with which the edge is normally acquirable from the image of the leads 146 of the QFP 140. As the reliability-related values, there are (i) a difference between opposite sides of the edge with respect to the brightness value of the image, (ii) a gradient of the change in the vicinity of the edge with respect to the brightness value of the image and (iii) a ratio between a number of predefined positive seek lines (that have been expected to intersect with the edge) and a number of ones of the positive seek lines that intersect with the edge, i.e., a rate of the number of the ones of the positive seek lines (each having an intersection with the edge, which is normally acquired), to the number of the positive seek lines. Where at least one of the reliability-related values is calculated, the calculated reliability-related value or values are supplied to the mounting control computer, so that it is possible to obtain a degree of appropriateness of the image that has been taken for the confirmation purpose. According to this arrangement, the degree of appropriateness of the image can be obtained by comparing the reliability-related value with a predetermined value (e.g., threshold value). The mounting control computer may include a reliability confirming portion that is configured to judge whether the reliability-related value is equal to or higher than a threshold value, such that the reliability confirming portion confirms that the image taken for the confirmation purpose is an appropriate image as long as it is judged that the reliability-related value is not lower than the threshold value.

There will be briefly described the process according to the light-emission-time/movement-velocity determining routine of FIG. 11, in the case where the bear chip 142 (see FIG. 6) is to be mounted onto the circuit board 32. As the case of the QFP 140, the bear chip 142 is held by the single-nozzle head 40, and the image of the bear chip 142 is taken by the CCD camera 250 with the flashlight being emitted from the LED strobe lighting device 260 for the standard emission time during movement of the bear chip 142 at the standard movement velocity (steps S1 and S2 of the routine of FIG. 11). Since the allowable image-shake amount for the bear chip 142 is also 25 µm, the standard movement velocity is 0.625 m/s while the standard movement velocity is 40 µs (see FIG. 14).

Then, the operator designates one of the bumps 154 of the bear chip 142 as the brightness-value defining part, with reference to the image of the bear chip 142 displayed on the display 326, and the brightness value B of the one of the bumps 154 (hereinafter simply referred to as "bump 154") designated as the brightness-value defining part is calculated (step S3 through S5). The calculated brightness value B represents a brightness value of the bump 154 relative to a brightness value of the main body 150 that constitutes the background surrounding the bump 154, since the main body 150 has a black color. Further, since the bump 154 has a surface like a mirror finished surface, the light reflectance of the bump 154 is higher and accordingly an amount of light reflected from the bump 154 is larger, as compared with the lead 146 of the QFP 140. Therefore, where the bump 154 is designated as the brightness-value defining part by the operator, the brightness value B of the brightness-value defining part is higher than the predetermined value β, so that a negative decision (NO) is obtained in step S6 whereby step S11 is implemented to judge whether the brightness value B is equal to or lower than the predetermined value α. In this step S11, too, a negative decision (NO) is obtained whereby step S12 is implemented to set the light emission time and movement velocity, to respective values of the combination that are determined for the high light reflectance, i.e., to 20 µs and 1.25 m/s, respectively, as shown in the uppermost table of FIG. 14.

Then, step S8 and steps following step S8 are implemented, so that the single-nozzle head 40 is moved at the movement velocity (that has been determined in step S12), and the image of the bear chip 142 is taken by the CCD camera 250 with the flashlight being emitted from the LED strobe lighting device 260 for the light emission time (that has been determined in step S12) during movement of the single-nozzle head 40 at the determined movement velocity. After the image has been acquired, predetermined procedures are carried out depending on whether the acquired image is appropriate or not.

There will be briefly described the process according to the light-emission-time/movement-velocity determining routine of FIG. 11, in the case where the connector 230 (see FIG. 8) is to be mounted onto the circuit board 32. In this case, the chuck head 44 as one of the component holding heads is held by the head holding device 46, and is moved to the tray-type component supplier 14. The chuck 210 of the chuck head 44 is operated for chucking the connector 230; so as to pick up the connector 230 from the tray 36 (step. S1). The allowable image-shake amount determined for the connector 230 is 25 µm, so that the chuck head 44 is moved at 0.625 m/s as the standard movement velocity, and the image of the connector 230 is taken by the CCD camera 250 with the flashlight being emitted from the LED strobe lighting device 260 for 40 µs as the standard emission time during movement of the connector 230 together with the chuck head 44 at the standard movement velocity (step S2). The taken image is displayed on the display 326 (step S3).

The operator designates, as the brightness-value defining part, a part of the connector 230, and the brightness value of the designated part is calculated (steps S4 and S5). Then, the calculated brightness value is compared with the predetermined values α, β(step S6). The designated part of the connector 230 is the main body 230 having a gray color. Since the light reflectance of the main body 232 is low and accordingly an amount of light reflected from the main body 232 is small, the brightness value is not higher than the predetermined values α, whereby a negative decision (NO) and a positive decision (YES) are obtained in steps S6 and S11, respectively. As a result of the positive decision (YES) in step S11, step S13 is implemented to set the light emission time and movement velocity, to respective values of the combination that are determined for the low light reflectance, i.e., to 80 μs and 0.3125 m/s, respectively, as shown in the uppermost table of FIG. 14. It is noted that the values of the combination (to which the light emission time and movement velocity are respectively set) are represented by one of three kinds of light-emission-time/movement-velocity determining data prepared for the allowable image-shake amount of 25 μm.

Then, step S8 and steps following step S8 are implemented, so that the chuck head 44 is moved at the movement velocity (that has been determined in step S13), and the image of the connector 230 is taken by the CCD camera 250 with the flashlight being emitted from the LED strobe lighting device 260 for the light emission time (that has been determined in step S13) during movement of the chuck head 44 at the determined movement velocity. After the image has been acquired, predetermined procedures are carried out depending on whether the acquired image is appropriate or not.

There will be briefly described the process according to the light-emission-time/movement-velocity determining routine of FIG. 11, in the case where the chip component 190 (see FIG. 7) is to be mounted onto the circuit board 32. The chip component 190, which is to be mounted onto the circuit board 32 by the multi-nozzle head 42 as one of the component holding heads, is held by one of the plurality of suction nozzles 164 of the multi-nozzle head 42, and the image of the chip component 190 is taken by the CCD camera 250, for thereby setting the light emission time and movement velocity to respective suitable values. The multi-nozzle head 42 is capable of holding and carrying a plurality of electronic circuit components which may be either the same or different in kind However, even where these electronic circuit components are different from each other in kind, the allowable image-shake amounts for the respective electronic circuit components are the same to each other, and the subject portions or brightness-value defining parts of the respective components have the same level of light reflectances. In an arrangement in which plural kinds of electronic circuit components are held by the multi-nozzle head 42 so as to be moved together with each other to the circuit board 32, for example, the light emission time and movement velocity are determined for the chip component 190 as one kind of the electronic circuit components, and the thus determined emission time and movement velocity are applied for the other kinds of the components, so that the determined light emission time and movement velocity are memorized in the light-emission-time/movement-velocity memory such that the memorized light emission time and movement velocity are associated with all of the kinds of components (held by the multi-nozzle head 42).

The multi-nozzle head 42 is moved to the feeder-type component supplier 12, and one of the suction nozzles 164 is vertically moved for picking up the chip component 190 from the feeder 34 (step S1). Since the allowable image-shake amount for the chip component 190 is 40 μm, the multi-nozzle head 42 is moved at 1 m/s as the standard movement velocity, and the image of the chip component 190 is taken by the CCD camera 250 with the flashlight being emitted from the LED strobe lighting device 260 for 40 μs as the standard emission time during movement of the chip component 190 together with the multi-nozzle head 42 at the standard movement velocity (step S2).

Then, the image of the chip component 190 is displayed on the display 326 (step S3). The operator designates, as the brightness-value defining part, a part of the chip component 190, and the brightness value of the designated part is calculated (steps S4 and S5). The calculated brightness value is compared with the predetermined values α, β(step S6). The designated part of the connector 190 is one of the terminals 194. Since the light reflectance of each of the terminals 194 is a standard value, the brightness value is also a standard value which is higher than the predetermined values a and is lower than the predetermined values p, whereby a positive decision (YES) is obtained in steps S6. As a result of the positive decision (YES) in step S6, step S7 is implemented to set the light emission time and movement velocity, to respective values of the combination that are determined for the standard blight reflectance, i.e., to 40 μs and 1 m/s, respectively, as shown in an intermediate one of the tables of FIG. 14. It is noted that the values of the combination (to which the light emission time and movement velocity are respectively set) are represented by one of three kinds of light-emission-time/movement-velocity determining data prepared for the allowable image-shake amount of 40 μm.

Then, the multi-nozzle head 42 is moved at the movement velocity (that has been determined in step S7), and the image of the chip component 190 is taken by the CCD camera 250 with the flashlight being emitted from the LED strobe lighting device 260 for the light emission time (that has been determined in step S7) during movement of the multi-nozzle head 42 at the determined movement velocity. After the image has been acquired, it is judged whether the acquired image is suitable for the image processing that is to be performed for the terminals 194, and then predetermined procedures are carried out depending on this judgment (steps S8-S10, S14).

Each electronic circuit component is mounted onto the circuit board 32 in accordance with the component mounting routine of FIG. 12, which will be described by way of example in which the QFP 140 is held by the single-nozzle head 40 held by the head holding device 46, and is mounted onto the circuit board 32. The component mounting routine is initiated with step S21 that is implemented to read, from the component mounting program, data regarding the electronic circuit component that is to be mounted onto the circuit board 32, so as to obtain the kind of the electronic circuit component (as which the QFP 140 is classified). The kind of the electronic circuit component which is obtained in step S21 is represented by the model number of the electronic circuit component. By obtaining the model number of the component, it is possible to obtain, for example, appearance and dimensions of the component. The "model number" of the component is a classification that is more specific than the "kind" of the component, with which the determined light emission time and movement velocity are to be associated. Therefore, by knowing the model number of the component, it is possible to know which one of the time length values and which one of the velocity values should be read as the given light emission time and movement velocity, from the light-emission-time/movement-velocity memory. In step S22, the light emission time and movement velocity, which are associated with the kind of the component obtained in step S21, are read from the light-emission-time/movement-velocity memory. In the case of the QFP 140, the read light emission time and movement velocity are 40 μs and 0.625 m/s, respectively.

Then, in step S23, the single-nozzle head 40 is moved to the feeder-type component supplier 12, and the QFP 140 is taken by the head 40 from the feeder 34. After having taken the QFP 140, the single-nozzle head 40 is moved to the board holder 16. During movement of the single-nozzle head 40 to the board holder 16, step S24 is implemented to execute an eventual image-taking operation by causing a corresponding one of the component-image taking units 22 to take the image of the QFP 140. In this instance, the LED strobe lighting device 260 is caused to emit flashlight for the time length value that has been read as the light emission time in step S22. While the flashlight is being emitted from the LED strobe lighting device 260, the image of the QFP 140 is taken by the CCD camera 250. A velocity of movement of the single-nozzle head 40 between the board holder 16 and each of the component suppliers 12, 14 is predetermined. However, the movement of the single-nozzle head 40 is made at the velocity value (as measured in the Y-axis direction) which has been read as the movement velocity in step S22, at least when the image of the QFP 140 is taken, i.e., when the flashlight is being emitted from the LED strobe lighting device 260 for the above-described time length value that has been read as the light emission time in step S22. That is, during movement of the single-nozzle head 40 between the board holder 16 and each of the component suppliers 12, 14, the velocity of the movement of the head 40 is changed as needed. Thus, the image of the QFP 140 is taken with the flashlight being emitted for the light emission time suitable for the light reflectance of the lead 146 (which is designated as the brightness-value defining part) of the QFP 140, thereby making it possible to avoid an actual image-shake amount from exceeding the allowable image-shake amount.

The data representing the taken image of the QFP 140 is processed by the image processing computer 314 such that a positional error of the QFP 140 held by the suction nozzle 114 is calculated and data representing the calculated positional error is supplied to the mounting control computer 310. Since the image of the QFP 140 is taken with the suitably determined light emission and movement velocity, it is possible to acquire the image suitable for the image processing that is to be performed for the lead 146 and accordingly to accurately calculate the positional error of the QFP 140.

Then, step S25 is implemented to mount the QFP 140 onto the circuit board 32. After the image of the QFP 140 has been taken, the velocity of the movement of the single-nozzle head 40 is changed back to the above-described predetermined velocity (that may be referred also to as "rapid feed rate"), and the QFP 140 is moved to the board holder 16 so as to be mounted onto the circuit board 32. In this instance, the positional error of the QFP 140 held by the suction nozzle 114, as well as a positional error of component mount portion of the circuit board 32 which is obtained by taking an image of the fiducial mark 244 by the CCD camera 240 of the fiducial-mark-image taking unit 20, is corrected or at least reduced. The positional error of the component mount portion is represented by a deviation of an actual position of the component mount portion from a desired position of the component mount portion in the X-axis direction and Y-axis direction and also a deviation of an actual angular position of the component mount portion from a desired angular position of the component mount portion. The deviation in the X-axis direction and Y-axis direction can be reduced by movement of the single-nozzle head 40 by the head moving device 48, while the angular deviation can be reduced by rotation of the single-nozzle head 40 by the head rotating device 52, so that the QFP 140 can be accurately mounted onto the component mount portion with its desired posture.

Where a plurality of electronic circuit components are to be mounted onto the circuit board 32 by the multi-nozzle head 42, the plurality of suction nozzles 164 hold the respective electronic circuit components. Therefore, in step S21, a plurality of data sets regarding the respective electronic circuit components are read for obtaining the kind of each of the components. If at least one of the components is different in kind from the other, a plurality of time length values and a plurality of velocity values are read from the light-emission-time/movement-velocity memory. However, the plurality of time length values are the same to each other, and the plurality of velocity values are the same to each other. This is because the allowable image-shake amounts of the respective electronic circuit components are the same to each other, and the brightness-value defining parts of the respective components have the same level of light reflectances, even where the electronic circuit components are different from each other in kind, as described above.

The multi-nozzle head 42 is moved to the feeder-type component supplier 12 so as to pick up the electronic circuit components in the form of the chip components 190, from the feeder 34 (step S23). During movement of the multi-nozzle head 42 to the board holder 16, all of the chip components 190 held by the multi-nozzle head 42 are concurrently imaged together with each other by the CCD camera 250 (step S24). The LED strobe lighting device 260 is caused to emit the flashlight for the time length value (40 μs) that has been read as the light emission time in step S22. The multi-nozzle head 42 is moved at the velocity value (1 m/s) that has been read as the movement velocity in step S22, as measured in the Y-axis direction, at least when the image of the chip components 190 is being taken by the CCD camera 250. The time length value and the velocity value, which have been read from the light-emission-time/movement-velocity memory in step S22, are common to all of the plurality of electronic circuit components which are held by the multi-nozzle head 42, so that the image of the components can be taken concurrently with each other. With all of the components being imaged once, the positional error of each of the components held by the head 42 is calculated. The positional error of each component as well as the positional error of the corresponding component mount portion of the circuit board 32 is corrected or at least reduced, and then each component is mounted onto the corresponding component mount portion of the circuit board 32 (step S25).

Where an electronic circuit component is to be mounted by the chuck head 44 onto the circuit board 32, for example, where the connector 230 is to be mounted by the chuck head 44, the chuck head 44 is held by the head holding device 46, and the connector 230 is taken from the tray 36 by the chuck head 44. During movement of the chuck head 44 to the board holder 16, an image of the connector 230 is taken by the CCD camera 250 with the flashlight being emitted from the LED strobe lighting device 260 for the time length value (80 μs) that has been read in step S22, while the connector 230 is being moved together with the chuck head 44 at the movement velocity (0.3125 m/s) that has been read in step S22 (step S24). Although the main body 232 as the brightness-value defining part of the connector 230 has a gray color and accordingly a low light reflectance, the light emission time and the movement velocity are set to a large time length value and a low velocity value, respectively, whereby it is possible to obtain a sufficient amount of image forming light for thereby enabling the image to have a brightness value suitable for the image processing, while it is possible to avoid an actual image-shake amount from exceeding the allowable image-shake amount for thereby enabling the positional error of the connector 230 as the component to be accurately obtained. After the image of the connector 230 has been taken, step S25 is implemented to move the connector 230 at the above-described predetermined velocity (i.e., rapid feed rate) and to mount the connector 230 onto the circuit board 32 with the positional error being corrected or at least reduced.

As is clear from the above description, in the present embodiment, the input device 318 constitutes a designation input device and a light-emission-time input device, the indicating device 328 constitutes a display device (described in the above-described mode (5)), and the buzzer 322 constitutes an acoustic information device. Further, the light-emission-time/movement-velocity memory of the mounting control computer 310 constitutes a light-emission-time/movement-velocity memory portion or a first memory portion, while the allowable image-shake amount memory of the mounting control computer 310 constitutes a movement-amount memory portion or a second memory portion which is configured to memorize a plurality of movement amount values that are different from each other such that each of the memorized plurality of movement amount values is associated with the corresponding kind of the subject portion. The mounting control computer 310 includes: a portion which is assigned to implement step S21 and which constitutes a subject-portion obtaining portion (described in the above-described mode (2)); and a portion which is assigned to implement step S22 and which is constitutes a light-emission-time/movement-velocity reading portion. The mounting control computer 310 further includes: a portion which is assigned to implement step S2 and which constitutes a trial image-taking portion (descried in the above-described mode (5)); portions which are assigned to implement steps S5-S7 and S11-S13 and which constitute a light-emission-time determining portion, a movement-velocity determining portion and a light-emission-time/movement-velocity determining portion; a portion which is assigned to implement step S8 and which constitutes a confirmation-image taking portion; a portion which is assigned to implement step S9 and which constitutes an edge-acquirability confirming portion; and a portion which is assigned to implement step S14 and which cooperates with the indicating device 328 and the buzzer 322 to constitute an informing portion. The mounting control computer 310 further includes portions which are assigned to implement steps S1-S13 and which constitute a light-emission-time/movement-velocity memory-portion-directed data preparing portion or a light-emission-time/movement-velocity data preparing portion as a first-memory-portion-directed data preparing portion. In the present embodiment, the mounting control computer 310 further includes a portion which is assigned to implement step S24 and which constitutes a control device configured, during movement of the subject portion by the subject-portion moving device, to cause the lighting device to emit the light for one of the plurality of time length values as the light emission time and to cause the image taking device to take the image of the subject portion, and is configured to control the movement velocity at which the subject portion is moved by the subject-portion moving device, such that an amount of the movement of the subject portion for the above-described one of the plurality of time length values as the light emission time is not larger than a predetermined movement amount. This control device cooperates with the above-described component-image taking units 22 and Y-axis direction moving device 56, to constitute a component-image taking system. In the present embodiment, the control device further includes the above-described reading portion, trial-image taking portion, light-emission-time determining portion, movement-velocity determining portion, light-emission-time/movement-velocity determining portion, confirmation-image taking portion, edge-acquirability confirming portion, and informing portion. Further, the image processing computer 314 constitutes an image processor. It is possible to interpret that the mounting control computer 310 still further includes a portion which is assigned to implement step S25 and which constitutes a component mounting controller. Meanwhile, the image processing computer 314 constitutes an image processor. It is also possible to interpret that the mounting control computer 310 further includes: portions which are assigned to implement steps S5-S7, S11-S13, S22 and which constitute a light-emission-time setting portion and a movement-velocity setting portion.

Figure 15:
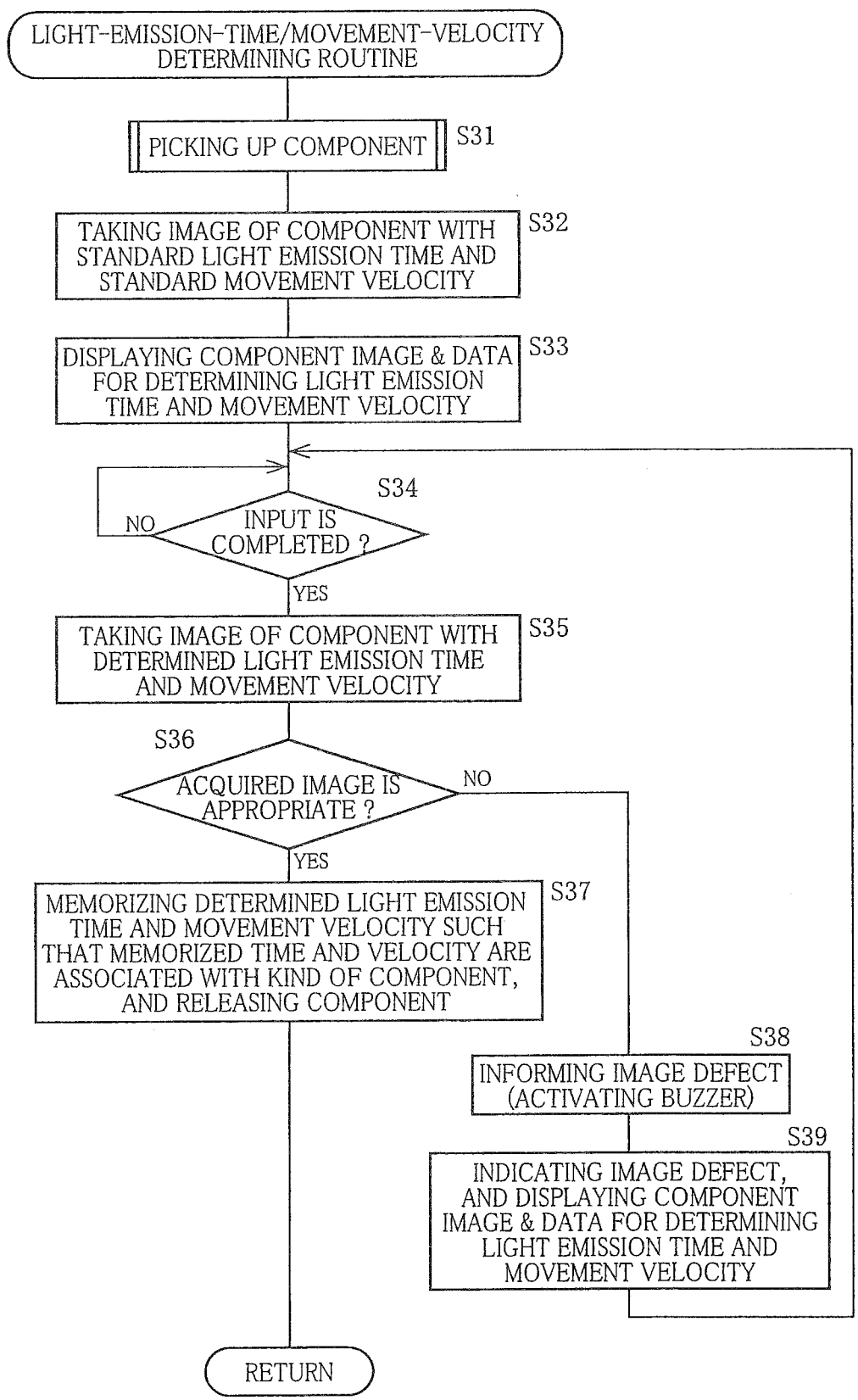
FIG. 15 is a flow chart showing a light-emission-time/movement-velocity determining routine in another embodiment of the invention.

In the above-described embodiment, the light emission time and the movement velocity are determined by the mounting control computer 310. However, the light emission time and the movement velocity may be determined manually by the operator as in another embodiment in which a light-emission-time/movement-velocity determining routine as shown in FIG. 15 is executed. Since the determination of the light emission time and movement velocity is made substantially in the same manner for all of the electronic circuit components, there will be described, by way of example, a case where the QFP 140 is to mounted on onto the circuit board 32. Further, since this embodiment is substantially the same as the above-described embodiment except for arrangements for the determination of the light emission time and movement velocity, the same reference signs as used in the above-described embodiment will be used to identify the functionally corresponding elements, and redundant description of these elements is not provided.

In the light-emission-time/movement-velocity determining routine of FIG. 15, steps S31 and S32 are implemented substantially in the same manner as steps S1 and S2 of the routine of FIG. 11, so that the QFP 140 held by the single-nozzle head 40 is moved at the standard movement velocity, and the image of the QFP 140 is taken by the CCD camera 250 with the flashlight being emitted from the LED strobe lighting device 260 during the movement of the QFP 140 at the standard movement velocity. Data representing the taken image of the QFP 140 is supplied to the mounting control computer 310. Then, in step S33, the image of the QFP 140 and the light-emission-time/movement-velocity determining data are displayed on the display 326 of the indicating device 328. The allowable image-shake amount for the QFP 140 is set to 25 μm, so that the display 326 displays the three combinations (each consisting of the corresponding light emission time and movement velocity) which are prepared for the allowable image-shake amount of 25 μm (see the uppermost table of FIG. 14). Referring to the image of the QFP 140, the operator selects one of the three combinations which is considered to be suitable for brightness of the leads 146 of the QFP 140, by operating the input device 318. Step S34 is repeatedly implemented until a signal indicative of completion of the selection is inputted. When the selection completion signal has been inputted, a positive decision (YES) is obtained in step S34 whereby step S35 is implemented to move the single-nozzle head 40 at the determined movement velocity (i.e., selected velocity value) and to take the image of the QFP 140 with the flashlight being emitted from the LED strobe lighting device 260 for the determined light emission time (i.e., selected time length value), for thereby executing the confirmation, image-taking operation.

Then, step S36 is implemented substantially in the same manner as in step S9 of the routine of FIG. 11. If the taken image has brightness suitable for the image processing, which is to be performed for the leads 146 so as to obtain the positional error of the QFP 140, a positive decision (YES) is obtained in step S36 so that the control flow goes to step S37. In step S37, the QFP 140 is released from single-nozzle head 40, and the light emission time and movement velocity determined or selected by the operator are memorized in the light-emission-time/movement-velocity memory such that the memorized emission time and movement velocity are associated with the kind of the electronic circuit component. On the other hand, if the taken image is not satisfactory enough to obtain the positional error of the QFP 140, a negative decision (NO) is obtained in step S36 so that the control flow goes to step S38 in which the operator is informed of the defect of image by activation of the buzzer 322.

Step S38 is followed by step S39 in which the image defect is indicated on the display 326. Further, as in step S33, the image of the QFP 140 and the light-emission-time/movement-velocity determining data are displayed on the display 326 in this step S39. The image of the QFP 140, which is displayed in this step S39, is the same one which has been taken in step S32 and displayed in step S33. The image displayed in step S33 is kept memorized even after the light emission time and movement velocity have been selected by the operator in step S34. After implementation of step S39, the control flow goes back to step S34 in which reselection of the light emission time and movement velocity is awaited. When the reselection has been made, the control flow goes to step S35 and steps flowing step S35 for final determination of the light emission time and movement velocity.

In this embodiment, the mounting control computer 310 includes: a portion which is assigned to implement step S32 and which constitutes a trial image-taking portion (described in the above-described mode (6)); a portion which is assigned to implement step S35 and which constitutes a confirmation-image taking portion; and a portion which is assigned to implement step S36 and which constitutes an edge acquirability confirming portion. The mounting control computer 310 further includes portions which are assigned to implement steps S31-S37 and which constitute a light-emission-time/movement-velocity-memory-portion-directed data preparing portion or a light-emission-time/movement-velocity data preparing portion as a first-memory-portion-directed data preparing portion. The mounting control computer 310 still further includes portions which are assigned to implement steps S38 and S39 and which cooperate with the indicating device 328 and the buzzer 322 to constitute an informing portion. The indicating device 328 constitutes a display device (described in the above-described mode (6)). The input device 318 constitutes a light-emission-time input device. In the present embodiment, since the light emission time as well as the movement velocity is selected through the input device 318, the input device 318 constitutes also a movement-velocity input device and a light-emission-time/movement-velocity input device. In this embodiment, as in the above-described embodiment, the mounting control computer 310 further includes a portion which is assigned to implement step S24 and which constitutes a control device configured, during movement of the subject portion by the subject-portion moving device, to cause the lighting device to emit the light for one of the plurality of time length values as the light emission time and to cause the image taking device to take the image of the subject portion, and is configured to control the movement velocity at which the subject portion is moved by the subject-portion moving device, such that an amount of the movement of the subject portion for the above-described one of the plurality of time length values as the light emission time is not larger than a predetermined movement amount. This control device cooperates with the above-described component-image taking units 22 and Y-axis direction moving device 56, to constitute a component-image taking system. In this embodiment, the control device further includes a light-emission-time/movement-velocity memory portion, a subject-portion obtaining portion and a light-emission-time/movement-velocity reading as in the above-described embodiment, in addition to the above-described trial-image taking portion, confirmation-image taking portion, edge-acquirability confirming portion and informing portion.

Figure 16:
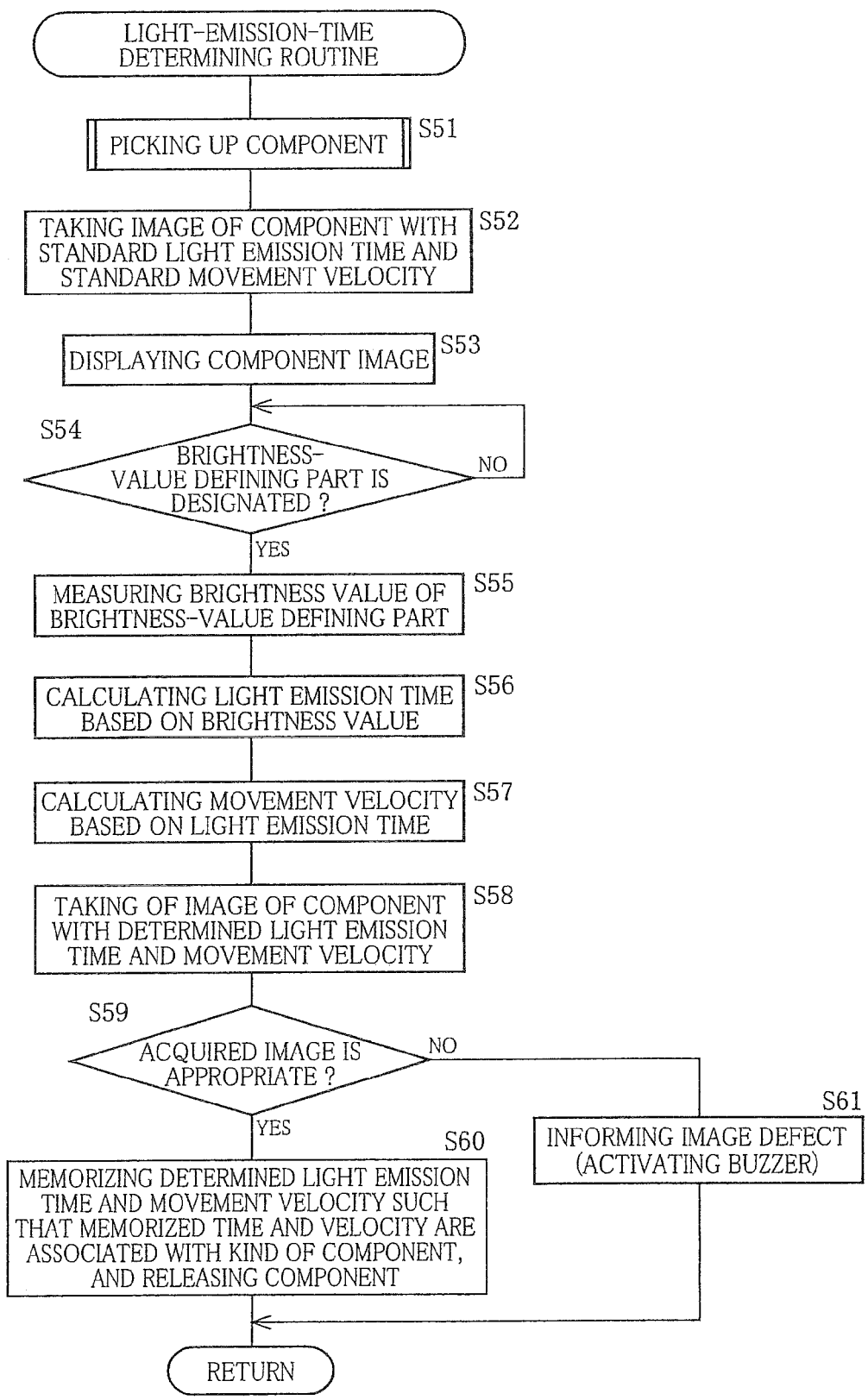
FIG. 16 is a flow chart showing a light-emission-time determining routine in still another embodiment of the invention.
Figure 17:
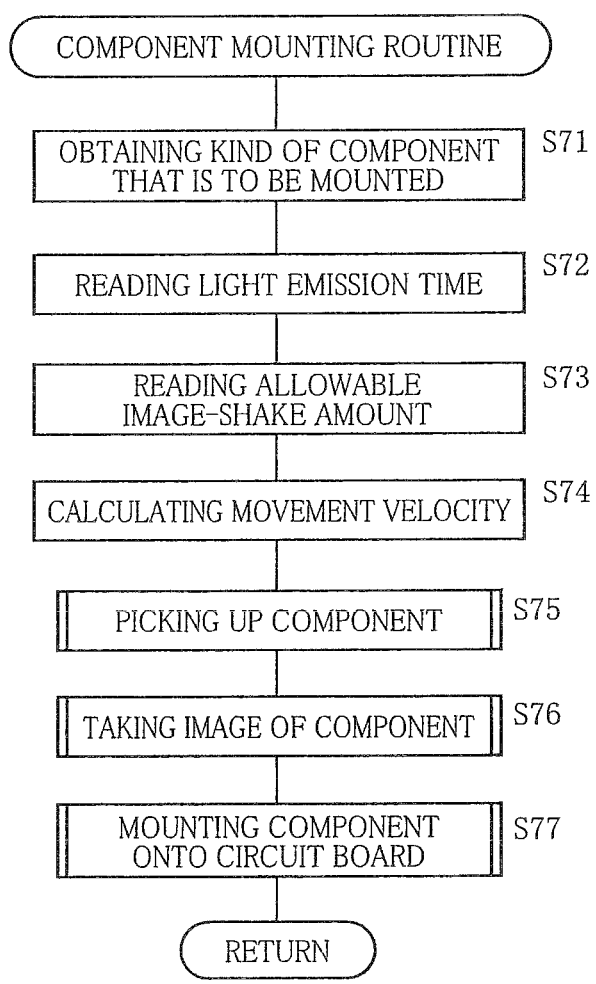
FIG. 17 is a flow chart showing a component mounting routine in which an image of an electronic circuit component is taken for a light emission time that is determined in the light-emission-time/movement-velocity determining routine of FIG. 16.

Although each of the light emission time and the movement velocity is changed in steps in the above-described embodiments, it may be changed without steps as in still another embodiment in which a light-emission-time determining routine as shown in FIG. 16 and a component mounting routine as shown in FIG. 17 are executed. In the following description regarding this embodiment, the same reference signs as used in the above-described embodiment of FIGS. 1-14 will be used to identify the functionally corresponding elements, and redundant description of these elements is not provided.

In the light-emission-time determining routine of FIG. 16, steps S51-S55 are implemented substantially in the same manner as steps S1-S5 of the routine of FIG. 11. When the operator has designated the brightness-value defining part through the input device 318 with reference to the image of the QFP 140 displayed on the display 326, a positive decision (YES) is obtained in step S54 whereby step S55 is implemented to calculate or measure the brightness value B of the brightness-value defining part. Then, in step S56, the light emission time is calculated based on the measured brightness value B by using a calculation formula (that is arranged for calculating a light emission time that makes it possible to obtain a suitable brightness value where the brightness value B is obtained by the standard emission tome). Step S56 is followed by step S57 in which the movement velocity is calculated based on the light emission time (calculated in step S56) and the allowable image-shake amount that is determined for the QFP 140, by using a calculation formula (that is expressed by (movement velocity)=(allowable image-shake amount)/(light emission time)). In this embodiment, since the light emission time and the movement velocity are continuously variable values, as described above, each of them is determined, by calculation using the calculation formula rather than selecting one of a finite number of predetermined values.

Then, in step S58 that is implemented to execute the confirmation image-taking operation, the image of the QFP 140 is taken again with the calculated light emission time and movement velocity. Step S58 is followed by step S59 that is implemented substantially in the same manner as step S9 of the routine of FIG. 11, so as to judge whether the acquired image is suitable for the image processing that is to be performed for the part designated by the operator. Where one of the leads 146 is designated as the brightness-value defining part by the operator, the brightness value of the designated one of the leads 146 is calculated, and the light emission time and the movement velocity are determined based on the calculated brightness value, namely, the light emission time and the movement velocity are set to respective values dependent on the calculated brightness value. Thus, the image of the QFP 140 taken with the thus determined light emission time and movement velocity is given a brightness suitable for the image processing performed for the designated one of the leads 146, so that it is possible to accurately obtain the positional error of the QFP 140 held by the suction nozzle 114. Thus, a positive decision (YES) is obtained in step S59 whereby the control flow goes to step S60 in which the calculated light emission time is memorized in a light-emission-time memory of the RAM 304 such that the memorized light emission time is associated with the kind of the electronic circuit component. On the other hand, if the image of the QFP 140 is not given the suitable brightness which is suitable for the image processing and which makes it possible to accurately obtain the positional error of the QFP 140, a negative decision (NO) is obtained in step S59 whereby the control flow goes to step S61 that is implemented substantially in the same manner as step S14 of the routine of FIG. 11.

The QFP 140 as the electronic circuit component is mounted onto the circuit board 32 in accordance with a component mounting routine of FIG. 17, which is initiated with step S71 that is implemented to read, from the component mounting program, the kind of the electronic circuit component (as which the QFP 140 is classified). In step S72, the light emission time, which is associated with the kind of the component obtained in step S71 (and which is determined for the QFP 140), are read from the light-emission-time memory. Then, step S73 is implemented to read, from the allowable image-shake amount memory, the allowable image-shake amount which is determined for the QFP 140. Step S73 is followed by step S74 that is implemented to calculate the movement velocity based on the light emission time and image-shake amount which have been read in steps S72 and S73, respectively.

Figure 12:
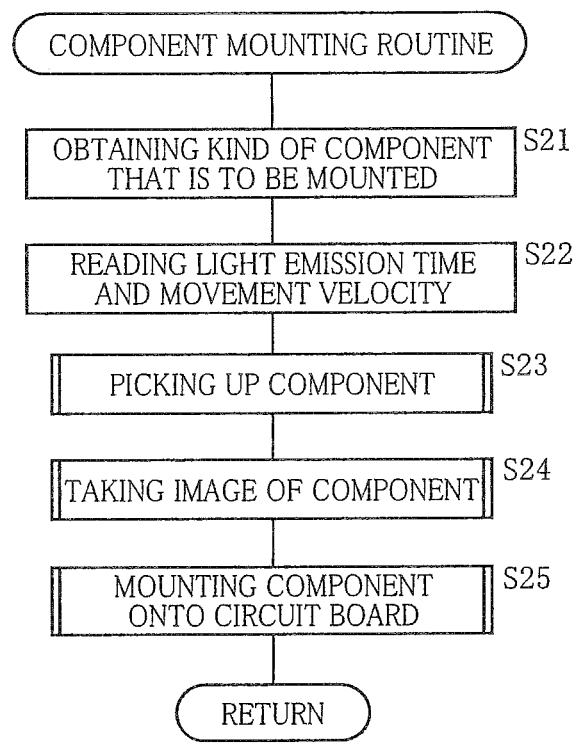
FIG. 12 is a flow chart showing a component mounting routine stored in the ROM of the above-described mounting control computer.

Then, steps S75-S77 are implemented substantially in the same manners as steps S23-S25 of the routine of FIG. 12. The QFP 140 is picked from the feeder 34, and the image of the QFP 140 is taken with the flashlight being emitted from the LED strobe lighting device 260 for the read light emission time while the single-nozzle head 40 holding the QFP 140 is being moved at the calculated movement velocity. The QFP 140 is mounted onto the circuit board 32, after the positional error of the QFP 140 has been calculated and corrected (or at least reduced).

In this embodiment, the light-emission-time memory of the RAM 304 of the mounting control computer 310 constitutes a light-emission-time memory portion or a first memory portion, while the allowable image-shake amount memory constitutes a movement-amount memory portion or a second memory portion. The mounting control computer 310 includes: a portion which is assigned to implement step S71 and which constitutes a subject-portion obtaining portion (described in each of the above-described modes (4) and (11)); a portion which is assigned to implement step S72 and which constitutes a light-emission-time reading portion; a portion which is assigned to implement step S73 and which constitutes a movement-amount reading portion; and a portion which is assigned to implement step S74 and which constitutes a movement-velocity calculating portion that is an example of a movement-velocity determining portion as a movement-velocity setting portion. The above-described light-emission-time memory portion, subject-portion obtaining portion (described in the above-described mode (4)) and light-emission-time reading portion (described in the above-described mode (4)) cooperate to constitute a light-emission-time setting portion. Further, the mounting control computer 310 includes: a portion which is assigned to implement step S52 and which constitute a trial image-taking portion; a portion which is assigned to implement step S56 and which constitutes a light-emission-time calculating portion that is an example of a light-emission-time determining portion; a portion which is assigned to implement step S58 and which constitutes a confirmation-image taking portion; a portion which is assigned to implement step S59 and which constitutes an edge-acquirability confirming portion; and a portion which is assigned to implement step S61 and which cooperates with the indicating device 328 and the buzzer 322 to constitute an informing portion. It is also possible to interpret that the mounting control computer 310 further includes positions which are assigned to implement steps S51-S60 and which constitute a data preparing portion configured to prepare a light emission time data that is to be stored in a light-emission-time memory portion or a first memory portion. In this embodiment, the mounting control computer 310 further includes a portion which is assigned to implement step S76 and which constitutes a control device configured, during movement of the subject portion by the subject-portion moving device, to cause the lighting device to emit the light for one of the plurality of time length values as the light emission time and to cause the image taking device to take the image of the subject portion, and is configured to control the movement velocity at which the subject portion is moved by the subject-portion moving device, such that an amount of the movement of the subject portion for the above-described one of the plurality of time length values as the light emission time is not larger than a predetermined movement amount. This control device cooperates with the above-described component-image taking units 22 and Y-axis direction moving device 56, to constitute a component-image taking system. In the present embodiment, the control device further includes the above-described movement-amount memory portion, subject-portion obtaining portion (described in the above-described mode (11)), movement-amount reading portion (described in the above-described mode (11)), movement-velocity calculating portion, light-emission-time setting portion, trial-image taking portion, light-emission-time calculating portion, confirmation-image taking portion, edge-acquirability confirming portion, and informing portion.

Figure 18:
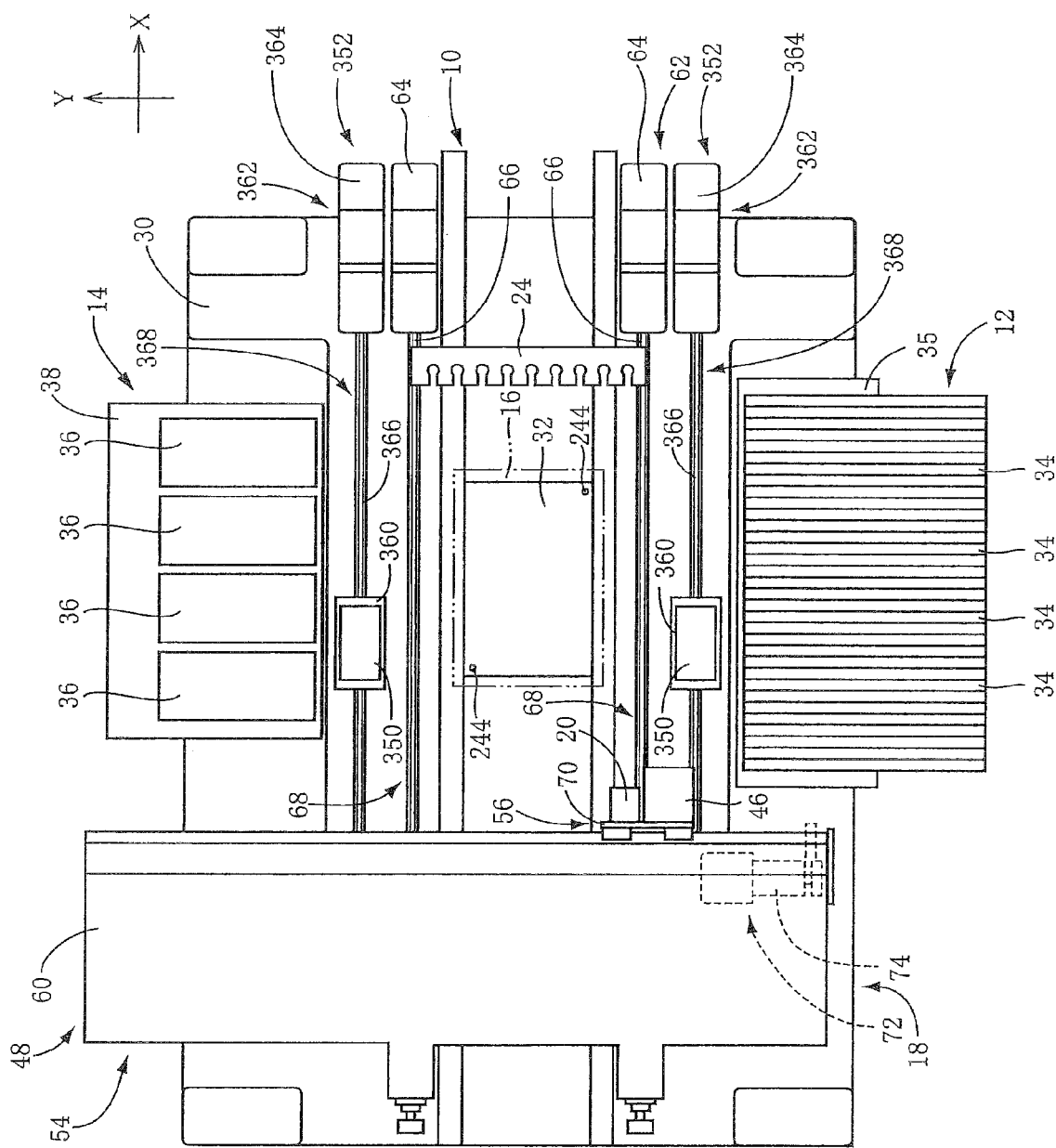
FIG. 18 is a plan view showing an electronic-circuit-component mounting machine constructed according to still another embodiment of the invention.

In the above-described three embodiments, each of the pair of component-image taking units 22 is moved together with the subject portion in the X-axis direction by the X-axis direction moving device 54. However, the component-image taking devices and the lighting devices may be moved in the X-axis direction, independently of the subject portion, by respective moving devices each of which is configured to move exclusively move the corresponding component-image taking device and lighting device, as in still another embodiment shown in FIG. 18. Since this embodiment is substantially the same as the above-described embodiments except for an arrangement in which a pair of component-image taking units 350 are moved by respective image-taking-unit moving devices 352, the same reference signs as used in the above-described embodiments will be used to identify the functionally corresponding elements, and redundant description of these elements is not provided.

Each of the image-taking-unit moving devices 352, which is provided exclusively for moving a corresponding one of the component-image taking units 350, is disposed between the board holder 16 of the bed 30 and a corresponding one of the component suppliers 12, 14, and includes a slide 360 as a movable member and a slide moving device 362. The slide moving device 362 is configured to move the slide 360 in directions parallel to the X-axis direction of the electronic-circuit-component mounting machine, i.e., in directions orthogonal to the direction in which the component suppliers 12, 14 and the board holder 16 are arranged on a plane parallel to a component mounted surface of the circuit board 32 held by the board holder 16.

The slide moving device 362 includes an image-taking-unit moving motor 364 as a drive source and a feed screw mechanism 368 that is constituted by a ball screw 366 and a nut (not shown). The ball screw 366 is disposed between a corresponding one of the component suppliers 12, 14 and a ball-screw holding portion of the bed 30 which holds a corresponding one of the ball screws 66 of the X-axis direction moving device 54 of the component mounter 18, such that the ball screw 366 is rotatable about its axis parallel to the X-axis direction and is immovable in its axial direction corresponding to the X-axis direction. The nut is held in thread engagement with the ball screw 366, and is fixed to the slide 360. Therefore, with rotation of the ball screw 366 by the image-taking-unit moving motor 364 that is constituted, for example, by a servo motor, the slide 360 can be moved to a desired position in the X-axis direction. The component-image taking unit 350, which is carried by the slide 360, has substantially the same construction as the above-described component-image taking unit 22, and includes the image taking device (constituted principally by the CCD camera and light guide device) and the lighting device (constituted principally by the LED strobe lighting device).

The pair of component-image taking units 350 and the respective image-taking-unit moving devices 352 are controllable by a mounting control computer (not shown). After having received the electronic circuit component from either one of the component suppliers 12, 14, the component holding head is moved toward the board holder 16. During the movement of the component holding head toward the board holder 16, the component holding head is caused to pass over a movement path of a corresponding one of the component-image taking units 350 which is parallel to the X-axis direction. In this instance, the component holding head is moved toward the board holder 16 along a movement path that varies depending on a position of a component supplying portion of a corresponding one of the component suppliers 12, 14 and a position of a component mount portion of the circuit board 32. Thus, an intersection between the movement paths of the component holding head and the corresponding component-image taking units 350 as seen in a plan view is calculated based on the position of the component supplying portion and the position of the component mount portion. Upon execution of an image taking operation, the corresponding component-image taking unit 350 is first moved to a position substantially aligned with the calculated intersection between the movement paths, so as to wait for the component holding head to pass over the component-image taking unit 350, so that the image of the electronic circuit component held by the component holding head can be taken by the component-image taking unit 350 when the component holding head passes over the component-image taking unit 350. The image taking operation is performed substantially in the same manner as in each of the above-described component-image taking units 22, so that an image of the electronic circuit component is taken by the CCD camera with flashlight being emitted from the LED strobe lighting device for a light emission time (which has been determined depending on the kind of the component) during the movement of the electronic circuit component at a movement velocity (which has been determined depending on the kind of the component) in a direction substantially orthogonal to the opposed direction in which the image taking device (including the CCD camera) and the subject portion are opposed to each other. In the present embodiment, the head moving device 48 constitutes a subject-portion moving device. The light emission time and the movement velocity may be determined substantially in the same manner as in any one of the above-described three embodiments shown in FIGS. 1-17. It is noted that the above-described direction orthogonal to the opposed direction contains component parallel to the X-axis direction and/or component parallel to the Y-axis direction, and that the subject portion is moved at the determined movement velocity at least when the image of the subject portion is being taken by the image taking device irrespective of whether the above-described orthogonal direction contains the component parallel to the X-axis direction or the component parallel to the Y-axis direction. In this embodiment, the component-image taking system is constituted by the component-image taking units 350, head moving device 48 and a control device that may be substantially the same in construction as the control device in any one of the above-described three embodiments.

While the preferred embodiments of the present invention have been described above in detail by reference to the accompanying drawings, for illustrative purpose only, it is to be understood that the present invention may be embodied otherwise.

For example, each of the image taking units may be disposed in a fixed position, which may be located, for example, in a certain portion of the bed, wherein the certain portion of the bed is located between the board holder and a corresponding one of the component suppliers, and positionally corresponds to an intermediate portion of the corresponding component supplier which is intermediate in the board conveying direction. In this arrangement, after having received the electronic circuit component from the corresponding component supplier, the component holding head is moved to the fixed image taking unit so that the image of the electronic circuit component is taken, during movement of the component holding head to the board holder.

Where the light emission time is determined prior to the component mounting operation and the movement velocity is determined upon execution of the component mounting operation (as in the embodiment shown in FIGS. 16 and 17), the light emission time may be either determined automatically based on the brightness value of the brightness-value detailing part, or determined manually by the operator. Both of the light emission time and movement velocity may be variable in steps, or one and the other of the light emission time and movement velocity may be variable in steps and variable without steps, respectively.

Where both of the light emission and the movement velocity are determined prior to the component mounting operation, both of the light emission time and movement velocity may be variable without steps, or one and the other of the light emission time and movement velocity may be variable in steps and variable without steps, respectively. Where both of the light emission time and movement velocity are variable without steps, it is possible to arrange a memory portion to memorize the light emission time calculated based on the brightness value of the subject portion, together with the movement velocity calculated for the image taking operation performed for the confirmation purpose, such that the memorized light emission time and movement velocity are associated with the kind of the subject portion. Where the movement velocity as an infinitely variable value is calculated and is memorized together with the determined emission time in a memory portion, it is possible to interpret that the control device includes: a portion which is configured to calculate the light emission time and which constitutes a light-emission-time determining portion as a light-emission-time setting portion; and a portion which is configured to calculate the movement velocity and which constitutes a movement-velocity determining portion as a movement-velocity setting portion.

Further, the movement velocity may be a value that is constant irrespective of the kind of the subject portion. In this arrangement, the movement velocity is determined based on an allowable image-shake amount that is allowable in an image processing performed for one of the kinds of the subject portion, which requires the image processing to be performed more accurately than the other kinds of the subject portion, namely, based on the smallest allowable image-shake amount as a common allowable image-shake amount that is common to all of the kinds of the subject portion.

Further, where the light emission time is determined by the operator, the light emission time may be an infinitely variable value so that the operator can select one from among an infinite number of time length values. In this arrangement, for example, seeing the image displayed on the display, the operator may estimate the light reflectance of the brightness-value defining part and determine the light emission time or select a time length value that is considered to enable the image processing to be performed most satisfactorily. For example, even where the subject portion is provided by the brightness-value defining part and its background has a gray color or other non-black color, it is necessary that the image of the subject portion has a sufficient contrast against the image of the background, for enabling the image processing to be satisfactorily performed for the subject portion. To this end, the operator determines the light emission time that reliably provides the brightness-value defining part with a brightness value suitable for giving the image of the subject portion the sufficient contrast against the image of the background, and inputs the determined light emission time into a computer. It is noted that such a determination of the light emission time may be made automatically by the computer.

Where the light emission time is memorized by the memory portion prior to the component mounting operation, the light emission time (that is to be memorized) does not necessarily have to be a time length value obtained by the trial image-taking operation, but may be a time length value obtained without the trial image-taking operation. For example, the operator may determine the light emission time based on, for example, construction, color and purpose of the subject portion or electronic circuit component, and arrange the memory portion to memorize the light emission time such that the memorized light emission time is associated with the kind of the subject portion or electronic circuit component. It is noted that such a determination of the light emission time may be made automatically by the computer.

Where the determined movement velocity of the subject portion upon taking of the image is lower than the above-described predetermined velocity (i.e., rapid feed rate) of the subject portion (i.e., movement velocity of the subject portion before and after taking of the image), the subject portion may be moved at a velocity that is still higher than the predetermined velocity, for thereby restraining increase of a length of time required for the movement of the subject portion from a movement start point to a movement end point.

Where the confirmation image-taking operation is executed after execution of the trial image-taking operation, it may be judged by the operator whether the designated part of the image is given a brightness value suitable for the image processing. In this arrangement, the operator can make the judgment, by seeing the display device that displays an image including the image of the subject portion that has been acquired by the confirmation image-taking operation.

Further, the determination of the light emission time may be made automatically without designation of the brightness-value defining part by the operator. Where the subject portion is constituted by at least a part of the electronic circuit component, the image of the component held by the component holder is taken with light being emitted from the lighting device for a light emission time (e.g., standard emission time) determined based on the allowable image-shake amount, during movement of the component at a movement velocity (e.g., standard movement velocity) determined based on the allowable image-shake amount. Then, the thus taken image is processed (substantially in the same manner as the processing performed for obtaining the positional error) in accordance with an image processing program, for thereby acquiring an edge of the electronic circuit component and finding the brightness-value defining part. This image processing program is a program that makes it possible to find the brightness-value defining part and the subject portion, namely, makes it possible to automatically designate, as the brightness-value defining part, a part of the image that is suitable for serving as the brightness-value defining part, even where the determined light emission time (e.g., standard emission time) and movement velocity (e.g., standard movement velocity) are so inappropriate that the taken image is too bright due to an excessively high brightness value of the brightness-value defining part or is too dark due to an excessively low brightness value of the brightness-value defining part. That is, it is possible to locate at least a point lying within the brightness-value defining part, not only where the above-described determined light emission time (e.g., standard emission time) and movement velocity (e.g., standard movement velocity) are values that enable the brightness-value defining part to be given a brightness value suitable for the image processing, but also where above-described determined light emission time and movement velocity are values that do not enable the brightness-value defining part to be given the suitable brightness value. After the point lying within the brightness-value defining part has been found, it is judged whether the brightness value of the brightness-value defining part is within a threshold range. If the brightness value is within the threshold range, the light emission time is set to the above-described determined light emission time (e.g., standard emission time). If the brightness value is higher than the threshold range, the light emission time is set to a time length value that is smaller than the above-described determined light emission time (e.g., standard emission time) by an amount corresponding to an amount of deviation of the brightness value from the threshold range. If the brightness value is lower than the threshold range, the light emission time is set to a time length value that is larger than the above-described determined light emission time (e.g., standard emission time) by an amount corresponding to an amount of deviation of the brightness value from the threshold range. Then, the confirmation image-taking operation is executed with the thus set light emission time and the movement velocity determined based on the set light emission time, and it is judged whether the above-described determined light emission time is appropriate. This judgment is made, for example, by checking if the brightness value of the brightness-value defining part is in the threshold range. If the brightness value is in the threshold range, it is confirmed that the image taken by the confirmation image-taking operation is appropriate for obtaining the positional error of the electronic circuit component held by the component holder, so that the light emission time and movement velocity used in the confirmation image-taking operation will be used for the eventual image-taking operation. On the other hand, if the brightness value is deviated from the threshold range, it is judged that the image taken by the confirmation image-taking operation is not appropriate, so that the operator is informed of defect of the image by activation of the informing portion. In this arrangement, the image taking system may be considered to include a brightness confirming portion as an image confirming portion and a light-emission-time automatically determining portion as a light-emission-time setting portion.

What is claimed is:

1. An image taking system comprising:
   (a) a lighting device capable of changing a light emission time to a plurality of time length values that are different from each other;
   (b) an image taking device configured to take an image of a subject portion while light is being emitted by said lighting device;
   (c) a subject-portion moving device configured to move the subject portion relative to said image taking device, in a direction substantially orthogonal to an opposed direction in which said image taking device and the subject portion are opposed to each other, and capable of changing a movement velocity of the subject portion relative to said image taking device, to a plurality of velocity values that are different from each other; and
   (d) a control device configured, during movement of the subject portion by said subject-portion moving device, to cause said lighting device to emit the light for a given light emission time as one of the plurality of time length values and to cause said image taking device to take the image of the subject portion, and is configured to control the movement velocity at which the subject portion is moved by said subject-portion moving device, such that an amount of the movement of the subject portion for the given light emission time is not larger than a given movement amount that corresponds to an allowable amount of shake of the image, the allowable amount of shake of the image being a selected one of allowable image-shake amounts that are determined for respective light-reflectance combinations, each of the light-reflectance combinations being a combination of a light reflectance of the subject portion and a light reflectance of an adjacent portion adjacent to the subject portion.

2. The image taking system according to claim 1,
   wherein said control device includes:
   (d-1) a light-emission-time/movement-velocity memory portion configured to memorize a plurality of sets each including the given light emission time and a given movement velocity, such that the given light emission time and the given movement velocity of each of the plurality of sets which are memorized in said light-emission-time/movement-velocity memory portion are associated with a corresponding one of the light-reflectance combinations;
   (d-2) a subject-portion obtaining portion configured to obtain (α) the light reflectance of the subject portion whose image is to be taken by said image taking device and (β) the light reflectance of the adjacent portion adjacent to the subject portion whose image is to be taken by said image taking device; and
   (d-3) a light-emission-time/movement-velocity reading portion configured to read, from said light-emission-time/movement-velocity memory portion, the given light emission time and the given movement velocity which are associated with one of the light-reflectance combinations which is the combination of the light reflectance of the subject portion and the light reflectance of the adjacent portion that are obtained by said subject-portion obtaining portion.

3. The image taking system according to claim 1,
   wherein said control device includes:
   (d-1) a light-emission-time setting portion configured to set the light emission time to the given light emission time as said one of the plurality of time length values; and
   (d-2) a movement-velocity setting portion configured to set the movement velocity to a given movement velocity that is based on the given light emission time to which the light emission time is set by said light-emission-time setting portion.

4. The image taking system according to claim 3,
   wherein said light-emission-time setting portion includes:
   (d-1-i) a light-emission-time memory portion configured to memorize a plurality of sets each including the given light emission time and a corresponding one of the light-reflectance combinations, such that the given light emission time and the corresponding one of the light-reflectance combinations of each of the plurality of sets which are memorized in said light-emission-time memory portion are associated with each other;
   (d-1-ii) a subject-portion obtaining portion configured to obtain (α) the light reflectance of the subject portion whose image is to be taken by said image taking device and (β) the light reflectance of the adjacent portion adjacent to the subject portion whose image is to be taken by said image taking device; and
   (d-1-iii) a light-emission-time reading portion configured to read, from said light-emission-time memory portion, the given light emission time which is associated with one of the light-reflectance combinations which is the combination of the light reflectance of the subject portion and the light reflectance of the adjacent portion that are obtained by said subject-portion obtaining portion.

5. The image taking system according to claim 1, comprising:
   a trial image-taking portion configured to cause said lighting device to emit the light for a standard emission time, and to cause said subject-portion moving device to move the subject portion relative to said image taking device at a standard movement velocity, for thereby causing said image taking device to trially take the image of the subject portion with emission of the light for the standard emission time during movement of the subject portion at the standard movement velocity;
   a display device configured to display a picture image containing the image of the subject portion which has been trially taken by said trial image-taking portion;
   a designation input device operable, by an operator, to designate a part of the picture image displayed by said display device; and
   a light-emission-time determining portion configured to obtain a value of brightness of the part of the picture image which is designated by said designation input device, and to determine the given light emission time, based on the obtained value of brightness of the part of the picture image.

6. The image taking system according to claim 1, comprising:
   a trial image-taking portion configured to cause said lighting device to emit the light for a standard emission time, and to cause said subject-portion moving device to move the subject portion relative to said image taking device at a standard movement velocity, for thereby causing said image taking device to trially take the image of the subject portion with emission of the light for the standard emission time during movement of the subject portion at the standard movement velocity;
   a display device configured to display a picture image containing the image of the subject portion which has been trially taken by said trial image-taking portion; and
   a light-emission-time input device operable, by an operator, to input the given light emission time which is determined by the operator based on the picture image displayed by said display device.

7. The image taking system according to claim 5, comprising:
a confirmation-image taking portion configured to cause said lightning device to emit the light for the given light emission time, and to cause said subject-portion moving device to move the subject portion relative to said image taking device at a given movement velocity which is determined based on the given light emission, for thereby causing said image taking device to take the image of the subject portion, which has been trially taken by said trial image-taking portion, with emission of the light for the given light emission time during movement of the subject portion at the given movement velocity; and
an image confirming portion configured to confirm appropriateness of the image taken by said confirmation-image taking portion.

8. The image taking system according to claim 6, comprising:
a confirmation-image taking portion configured to cause said lightning device to emit the light for the given light emission time, and to cause said subject-portion moving device to move the subject portion relative to said image taking device at a given movement velocity which is determined based on the given light emission, for thereby causing said image taking device to take the image of the subject portion, which has been trially taken by said trial image-taking portion, with emission of the light for the given light emission time during movement of the subject portion at the given movement velocity; and
an image confirming portion configured to confirm appropriateness of the image taken by said confirmation-image taking portion.

9. The image taking system according to claim 7, wherein said image confirming portion includes an edge-acquirability confirming portion configured to confirm that an edge of the subject portion is acquirable by processing the image taken by said confirmation-image taking portion.

10. The image taking system according to claim 7, wherein said image confirming portion includes a reliability confirming portion which is configured to obtain a reliability-related value related to a degree of reliability with which an edge of the subject portion is acquirable by processing the image taken by said confirmation-image taking portion, and which is configured to confirm that the reliability-related value is not smaller than a threshold value.

11. The image taking system according to claim 7, wherein said image confirming portion includes a brightness confirming portion which is configured to obtain a value of brightness of a brightness-value defining part of the image whose value of brightness is to be obtained for determining the given light emission time, and which is configured to confirm that the obtained value of brightness is within a threshold range.

12. The image taking system according to claim 1, comprising:
a movement-amount memory portion configured to memorize a plurality of sets each including the given movement amount and a corresponding one of the light-reflectance combinations, such that the given movement amount and the corresponding one of the light-reflectance combinations of each of the plurality of sets which are memorized in said movement-amount memory portion are associated with each other;
a subject-portion obtaining portion configured to obtain (α) the light reflectance of the subject portion whose image is to be taken by said image taking device and (β) the light reflectance of the adjacent portion adjacent to the subject portion whose image is to be taken by said image taking device; and
a movement-amount reading portion configured to read, from said movement-amount memory portion, the given movement amount which is associated with one of the light-reflectance combinations which is the combination of the light reflectance of the subject portion and the light reflectance of the adjacent portion that are obtained by said subject-portion obtaining portion.

13. The image taking system according to claim 1, wherein said lighting device is constituted by a LED strobe lighting device.

14. An electronic-circuit-component mounting machine comprising:
a board holder configured to hold a circuit board;
a component mounter configured to mount an electronic circuit component onto the circuit board that is held by said board holder;
a component supplier configured to supply the electronic circuit component to said component mounter, whereby the electronic circuit component is received by a component holder of said component mounter;
a component-image taking system configured to take an image of at least a part of the electronic circuit component which is held by said component holder;
an image processor configured to obtain a positional error of the electronic circuit component which is held by said component holder, based on the image taken by said component-image taking system; and
a component mounting controller configured to control said component mounter such that the electronic circuit component is mounted onto the circuit board with the positional error being at least reduced,
wherein said component-image taking system is provided by the image taking system that is recited in claim 1.

* * * * *